United States Patent
Sakui et al.

(10) Patent No.: US 12,396,153 B2
(45) Date of Patent: Aug. 19, 2025

(54) SEMICONDUCTOR ELEMENT MEMORY DEVICE

(71) Applicant: Unisantis Electronics Singapore Pte. Ltd., Singapore (SG)

(72) Inventors: Koji Sakui, Tokyo (JP); Nozomu Harada, Tokyo (JP)

(73) Assignee: UNISANTIS ELECTRONICS SINGAPORE PTE. LTD., Singapore (SG)

(*) Notice: Subject to any disclaimer, the term of this patent is extended or adjusted under 35 U.S.C. 154(b) by 274 days.

(21) Appl. No.: 18/226,096

(22) Filed: Jul. 25, 2023

(65) Prior Publication Data

US 2023/0380138 A1    Nov. 23, 2023

Related U.S. Application Data

(63) Continuation-in-part of application No. PCT/JP2021/003693, filed on Feb. 2, 2021.

(51) Int. Cl.
*G11C 11/404*    (2006.01)
*G11C 11/4091*   (2006.01)
(Continued)

(52) U.S. Cl.
CPC .......... *H10B 12/20* (2023.02); *G11C 11/404* (2013.01); *G11C 11/4091* (2013.01); *G11C 11/4096* (2013.01)

(58) Field of Classification Search
CPC ... H10B 12/20; G11C 11/404; G11C 11/4091; G11C 11/4096; G11C 11/401
See application file for complete search history.

(56) References Cited

U.S. PATENT DOCUMENTS

| | | | |
|---|---|---|---|
| 5,453,955 A | 9/1995 | Sakui et al. | |
| 7,525,141 B1* | 4/2009 | Forbes | H10B 12/482 257/296 |

(Continued)

FOREIGN PATENT DOCUMENTS

| | | |
|---|---|---|
| JP | H02188966 A | 7/1990 |
| JP | H03171768 A | 7/1991 |

(Continued)

OTHER PUBLICATIONS

English Translation of Written Opinion of The International Searching Authority, PCT/JP2022/017819, Jun. 21, 2022. (Year: 2022).*

(Continued)

*Primary Examiner* — Mushfique Siddique
(74) *Attorney, Agent, or Firm* — Crowell & Moring LLP

(57) ABSTRACT

A data retention operation of holding positive hole groups generated by an impact ionization phenomenon or by a gate-induced drain leakage current in a semiconductor base body is performed by controlling voltages applied to plate lines, word lines, a source line, odd-numbered bit lines, and even-numbered bit lines; and a data erase operation is performed by removing positive hole groups from inside the semiconductor base body by controlling the voltages applied to plate lines, word lines, source line, odd-numbered bit lines, and even-numbered bit lines and lowering a voltage of The semiconductor base body by means of capacitive coupling between the plate lines and word lines. A block is made up of memory cells arrayed in a matrix, and storage data is read from the memory cells in the block alternately to the odd-numbered bit lines and even-numbered bit line.

12 Claims, 15 Drawing Sheets

(51) Int. Cl.
*G11C 11/4096* (2006.01)
*H10B 12/00* (2023.01)

(56) References Cited

U.S. PATENT DOCUMENTS

| | | | | |
|---|---|---|---|---|
| 12,315,558 | B2* | 5/2025 | Sakui | G11C 11/4091 |
| 2006/0049444 | A1 | 3/2006 | Shino | |
| 2008/0212366 | A1 | 9/2008 | Ohsawa | |
| 2008/0239789 | A1* | 10/2008 | Shino | H10B 12/01 |
| | | | | 365/174 |
| 2016/0204251 | A1* | 7/2016 | Masuoka | H10D 84/0177 |
| | | | | 257/329 |
| 2017/0330623 | A1* | 11/2017 | Kim | G11C 11/5628 |
| 2019/0066762 | A1* | 2/2019 | Koya | G11C 11/4087 |
| 2023/0282576 | A1* | 9/2023 | Yang | H10B 43/20 |
| 2023/0284433 | A1* | 9/2023 | Sakui | G11C 11/4096 |

FOREIGN PATENT DOCUMENTS

| | | |
|---|---|---|
| JP | 2006-80280 A | 3/2006 |
| JP | H3957774 | 5/2007 |
| JP | 2008-218556 | 9/2008 |
| JP | 3210355 | 4/2017 |

OTHER PUBLICATIONS

Written Opinion of the International Searching Authority in International Application No. PCT/JP2021/003693, dated Mar. 30, 2021 (4 pages).
Takato, H., et al., "Impact of Surrounding Gate Transistor (SGT) for Ultra-High-Density LSI's", *IEEE Transactions on Electron Devices*, vol. 38, No. 3, Mar. 1991, pp. 573-578 (6 pages).
Chung, H., et al., "Novel 4F$^2$ DRAM Cell with Vertical Pillar Transistor(VPT)" *2011 Proceedings of the European Solid-State Device Research Conference* (2011) (4 pages).
Wong, H.S., P., et al., "Phase Change Memory" *Proceedings of the IEEE*, vol. 98, No. 12, Dec. 2010, pp. 2201-2227 (27 pages).
Tsunoda, K., et al., "Low Power and High Speed Switching of Ti—doped NiO ReRAM under the Unipolar Voltage Source of less than 3 V" IEDM (2007) pp. 767-770, (4 pages).
Kang, W., et al., "Reconfigurable Codesign of STT-MRAM Under Process Variations in Deeply Scaled Technology" *IEEE Transactions on Electron Devices*, vol. 62, No. 6, Jun. 2015, pp. 1769-1777 (9 pages).
Ertosun, M. G., et al., "Novel Capacitorless Single-Transistor Charge-Trap DRAM 1T CT DRAM) Utilizing Electrons" *IEEE Electron Device Letters*, vol. 31, No. 5, May 2010, pp. 405-407 (3 pages).
Wan, J., et al., "A Compact Capacitor-Less High-Speed DRAM Using Field Effect-Controlled Charge Regeneration" *IEEE Electron Device Letters*, vol. 33, No. 2, Feb. 2012, pp. 179-181 (3 pages).
Ohsawa, T., et al., "Memory Design Using a One-Transistor Gain Cell on SOI", *IEEE Journal of Solid-State Circuits*, vol. 37, No. 11, Nov. 2022, pp. 1510-1522 (13 pages).
Shino, T., et al., "Floating Body RAM Technology and its Scalability to 32nm Node and Beyond", IEEE IEDM (2006) (4 pages).
Yoshida, E., et al., "A Design of a Capacitorless 1T-DRAM Cell Using Gate-induced Drain Leakage (GIDL) Current for Low-power and High-speed Embedded Memory" IEEE IEDM, pp. 913-916, Dec. 2003 (4 pages).
Song, J., et al., "Design Optimization of Gate-All-Around (GAA) MOSFETs" *IEEE Transactions on Nanotechnology*, vol. 5, No. 3, pp. 186-191, May 2006 (7 pages).
Loubet, N., et al., "Stacked Nanosheet Gate-All-Around Transistor to Enable Scaling Beyond FinFET" *2017 Symposium on VLSI Technology Digest of Technical Papers*, T230-T231, Jun. 2017 (2 pages).
Jiang, H., et al., "Experimental Investigation of Self-Heating Effect (SHE) in Multiple-Fin SOI FinFETS"*Semicond. Sci. Technol.* 29 (2014) 115021 (9 pages).
Yoshida, E., et al., "A Capacitorless 1T-DRAM Technology Using Gate-Induced Drain-Leakage (GIDL) Current for Low-Power and High-Speed Embedded Memory" *IEEE Transactions on Electron Devices*, vol. 53, No. 4, Apr. 2006 (6 pages).

* cited by examiner

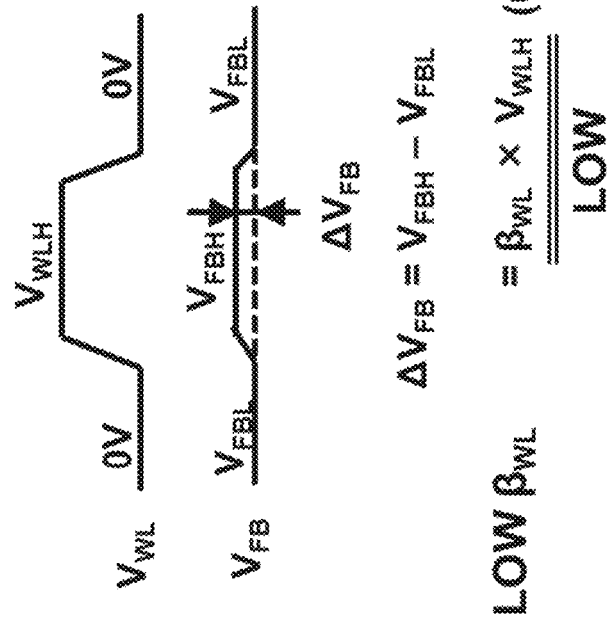

FIG. 2A

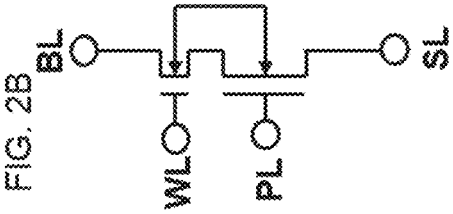

FIG. 2B

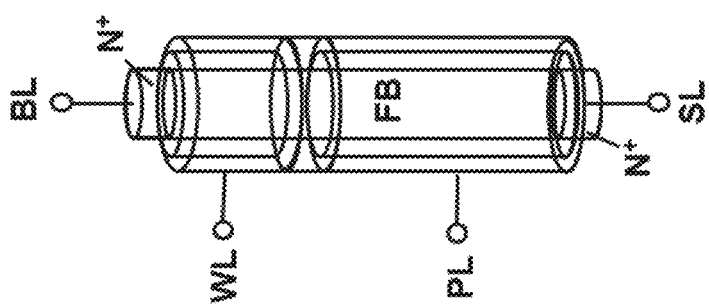

FIG. 2C $$C_{FB} = C_{WL} + C_{PL} + C_{BL} + C_{SL} \quad (1)$$

$$\beta_{WL} = \frac{C_{WL}}{C_{WL} + C_{PL} + C_{BL} + C_{SL}} \quad (2) \Rightarrow \text{LOW } \beta_{WL}$$

$$\beta_{PL} = \frac{C_{PL}}{C_{WL} + C_{PL} + C_{BL} + C_{SL}} \quad (3) \Rightarrow \text{HIGH } \beta_{PL}$$

$$\beta_{BL} = \frac{C_{BL}}{C_{WL} + C_{PL} + C_{BL} + C_{SL}} \quad (4) \Rightarrow \text{LOW } \beta_{BL}$$

$$\beta_{SL} = \frac{C_{SL}}{C_{WL} + C_{PL} + C_{BL} + C_{SL}} \quad (5) \Rightarrow \text{LOW } \beta_{SL}$$

$$\Delta V_{FB} = V_{FBH} - V_{FBL} = \beta_{WL} \times V_{WLH} \quad (6) \Rightarrow \text{LOW}$$

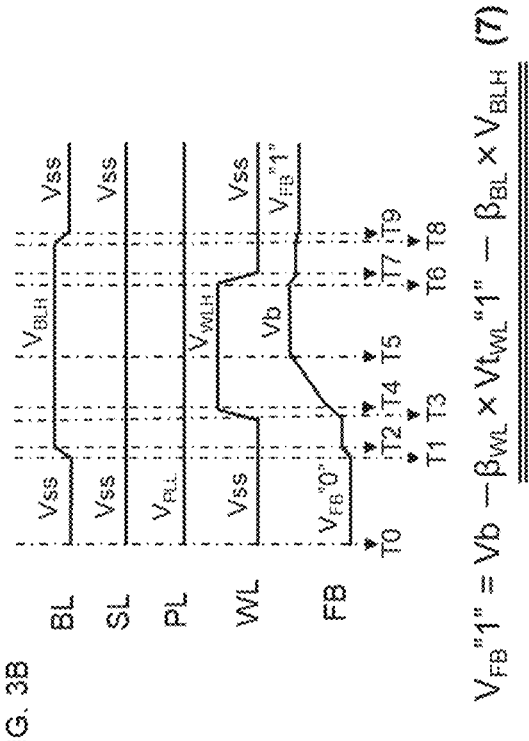
FIG. 3A "1" WRITING OPERATION
SOURCE-SIDE IMPACT IONIZATION
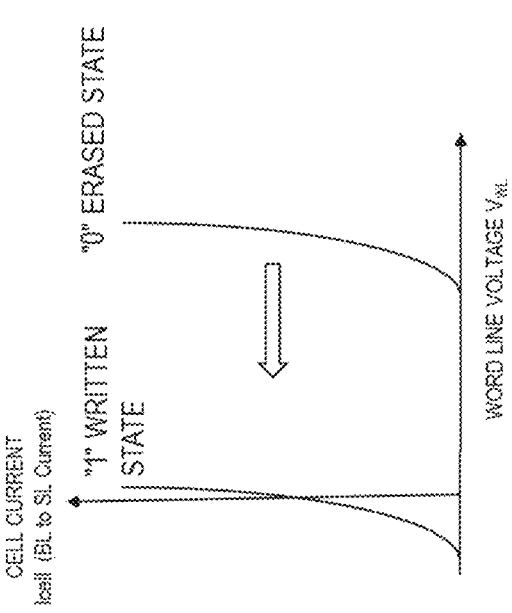
FIG. 3B
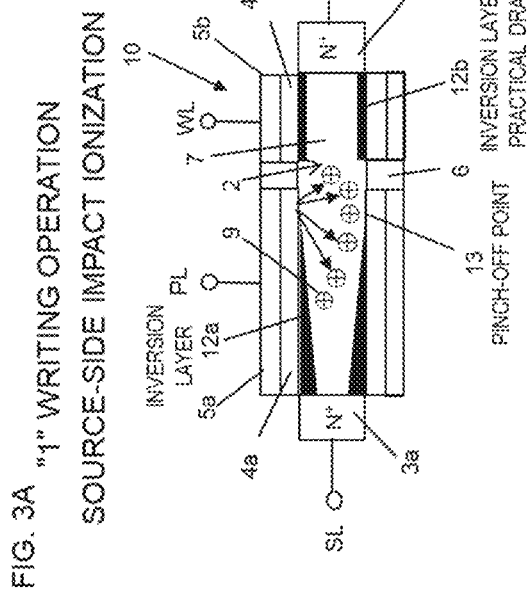
FIG. 3C "1" WRITTEN STATE
$$V_{FB}"1" = V_b - \beta_{WL} \times Vt_{WL}"1" - \beta_{BL} \times V_{BLH} \quad (7)$$
LOW
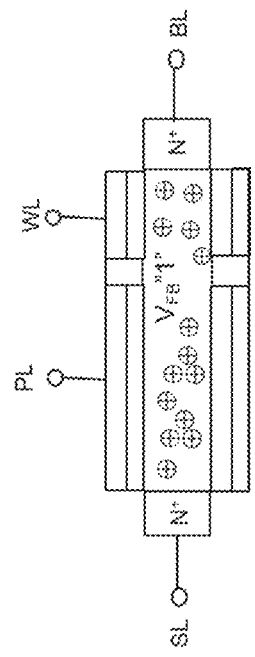
FIG. 3D

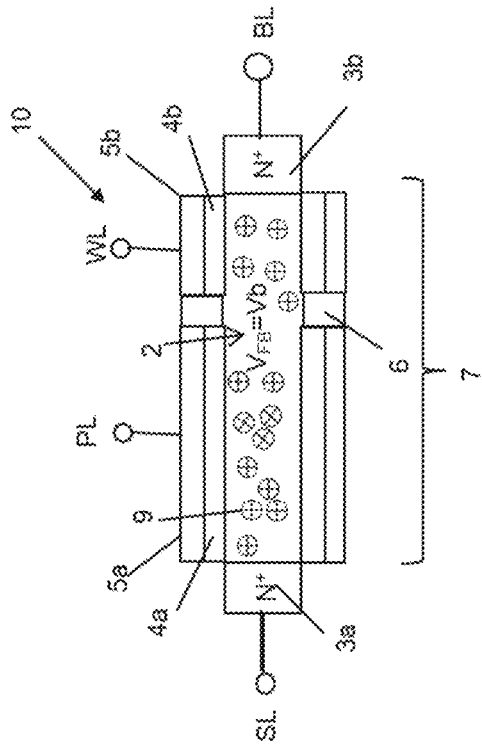
FIG. 4AA "1" WRITTEN STATE
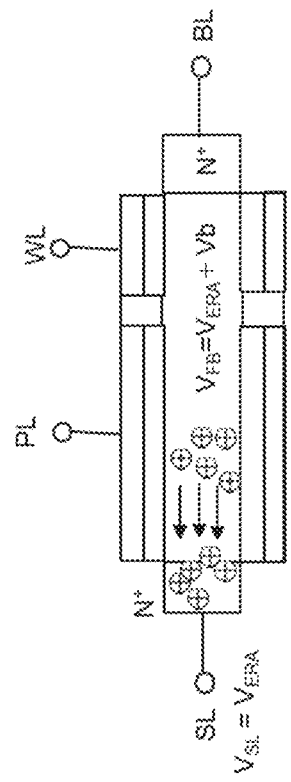
FIG. 4AB "0" ERASED STATE
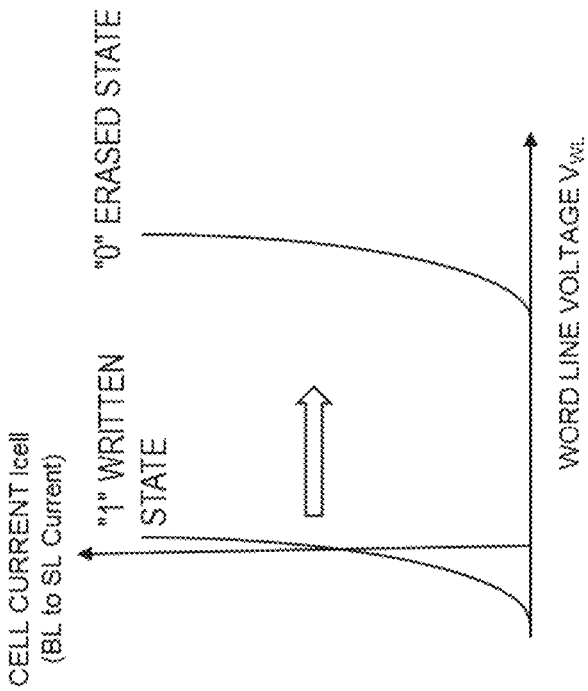
FIG. 4AC

FIG. 4B

ERASE OPERATION

| | SIGNAL LINE | APPLIED VOLTAGE |
|---|---|---|
| "0" ERASING | BIT LINE BL | $V_{SS}$ (EXAMPLE: 0V) |
| | SOURCE LINE SL | $V_{ERA}$ (EXAMPLE: -3V) |
| | PLATE LINE PL | $V_{PLL}$ (EXAMPLE: 2V) |
| | WORD LINE WL | $V_{SS}$ (EXAMPLE: 0V) |
| | FLOATING BODY FB | $V_{ERA} + V_b$ (EXAMPLE: -3V + 0.7V = -2.3V) |

$V_b$: BUILT-IN VOLTAGE OF PN JUNCTION: TO 0.7 V

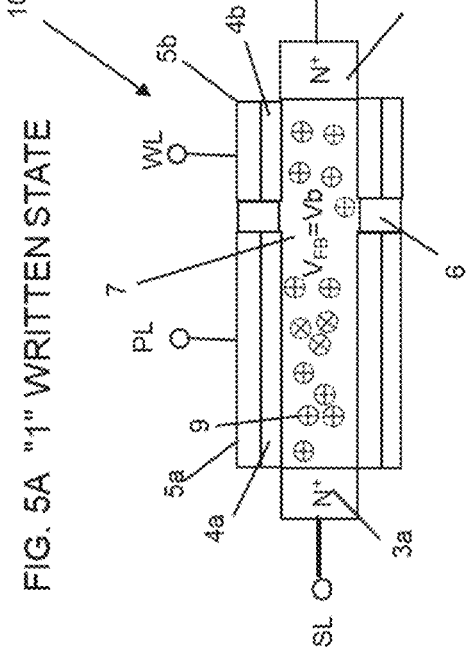
FIG. 5A "1" WRITTEN STATE
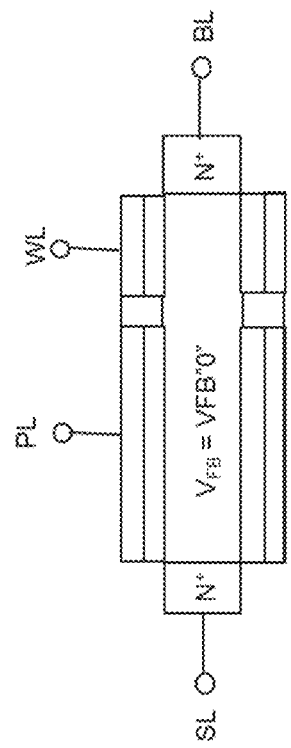
FIG. 5B "0" ERASED STATE
Vb: BUILT-IN VOLTAGE: TO 0.7 V
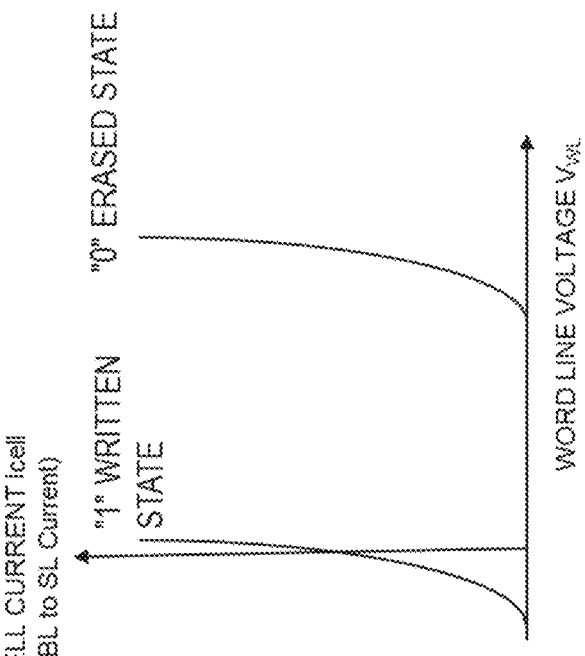
FIG. 5C

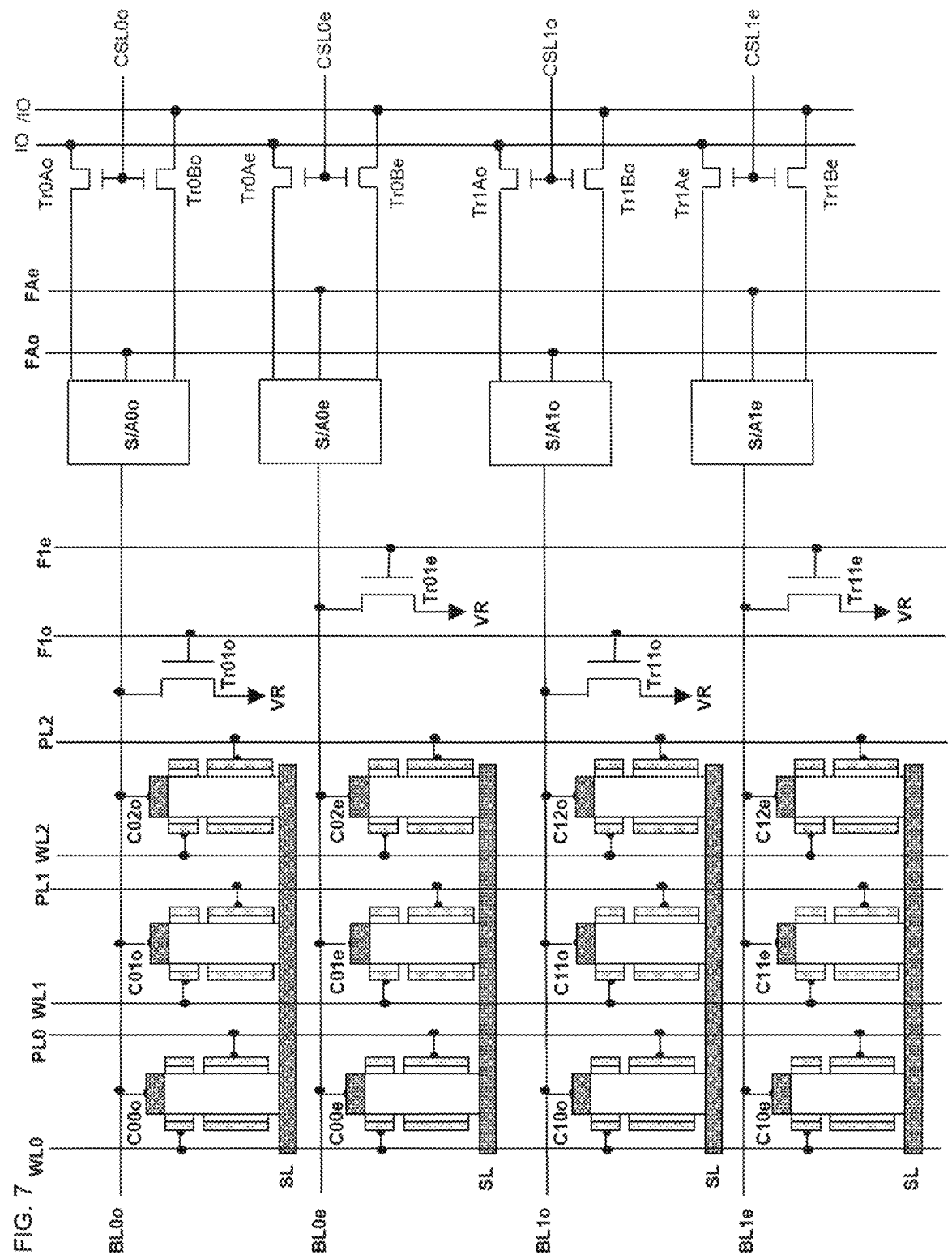

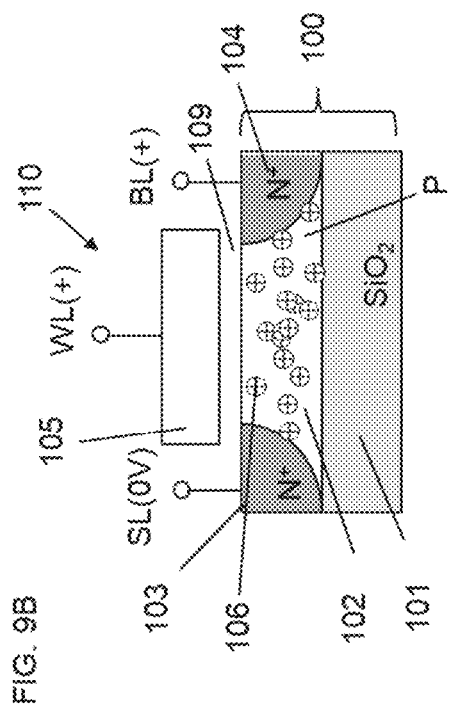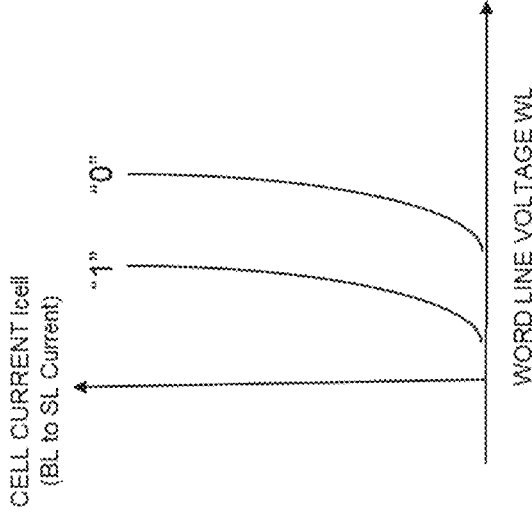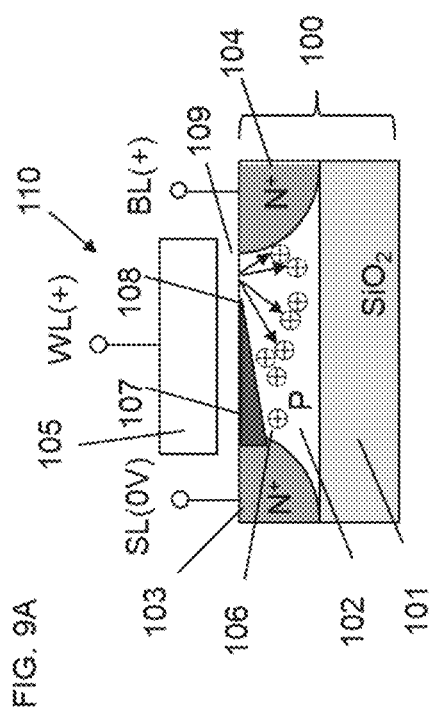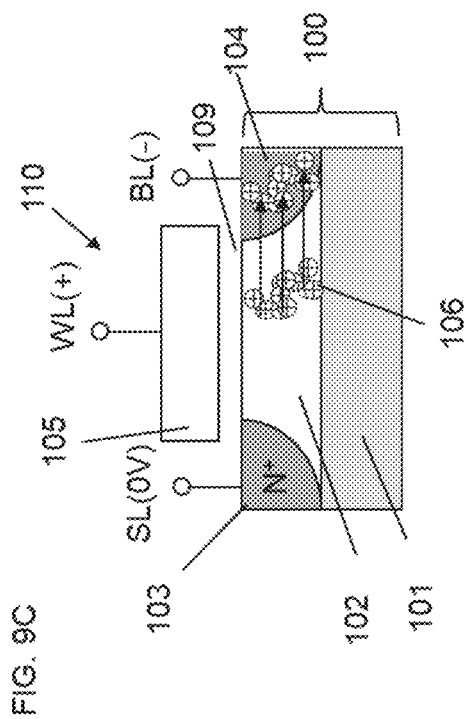

$$C_{FB} = C_{WL} + C_{BL} + C_{SL} \quad (8)$$

$$\beta_{WL} = \frac{C_{WL}}{C_{WL} + C_{BL} + C_{SL}} \quad (9)$$

$$\Delta V_{FB} = V_{FB2} - V_{FB1}$$
$$= \beta_{WL} \times V_{WLH} \quad (10)$$

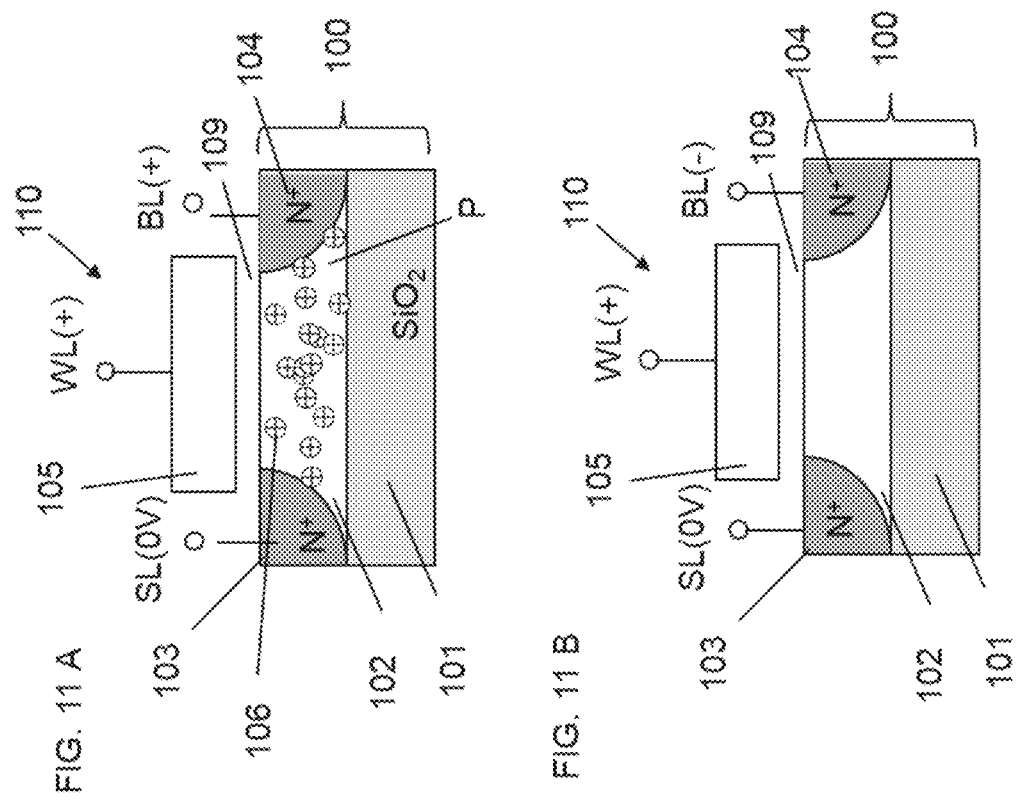

SEMICONDUCTOR ELEMENT MEMORY DEVICE

INCORPORATION BY REFERENCE

The present application is a Continuation-In-Part application of PCT/JP2021/003693, filed Feb. 2, 2021, the entire contents of which are incorporated herein by reference.

BACKGROUND OF THE INVENTION

Field of the Invention

The present invention relates to a semiconductor memory device that uses semiconductor elements.

Description of the Related Art

Recently, there has been demand for greater packaging density and higher performance of memory elements in the development of LSI (Large Scale integration) technology.

In normal planar MOS transistors, a channel extends in a horizontal direction along an upper surface of a semiconductor substrate. In contrast, a channel of SGTs extends in a vertical direction along an upper surface of a semiconductor substrate (see, for example, Japanese Patent Laid-Open No. 2-188966 and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)). Consequently, the SGTs allow higher packaging density of a semiconductor device than do the planar MOS transistors. The use of the SGTs as selection transistors allows greater packaging density of DRAMs (Dynamic Random Access Memories; see, for example, H. Chung, H. Kim, H. Kim, K. Kim, S. Kim, K. Dong, J. Kim, Y. C. Oh, Y. Hwang, H. Hong, G. Jin, and C. Chung: "4F2 DRAM Cell with Vertical Pillar Transistor (VPT)," 2011 Proceeding of the European Solid-State Device Research Conference, (2011)) connected with capacitors, PCMs (Phase Change Memories; see, for example, H. S. Philip Wong, S. Raoux, S. Kim, Jiale Liang, J. R. Reifenberg, B. Rajendran, Asheghi and K. E. Goodson, "Phase Change Memory," Proceeding of IEEE, Vol. 98, No 12, December, pp. 2201-2227 (2010)) connected with variable resistance elements, RRAMs (Resistive Random Access Memories; see, for example, T. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and High Speed Switching of Ti-doped NiO ReRAM under the Unipolar Voltage Source of less than 3V," IEDM (2007)), and MRAMs (Magnetoresistive Random Access Memories; see, for example, W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015) that varies resistance by changing magnetic spin direction by means of current. There is also a DRAM memory cell (see J. Wan, L. Rojer, A. Zaslavsky, and S. Critoloveanu: "A Compact Capacitor-Less High-Speed DRAM Using Field Effect-Controlled. Charge Regeneration," Electron Device Letters, Vol. 35, No. 2, pp. 179-181 (2012)) made up of a single MOS transistor without a capacitor. The present application relates to a dynamic flash memory that can be made up of MOS transistors without a variable resistance element or a capacitor.

FIGS. 9A to 9D show a write operation of the above-mentioned capacitorless DRAM memory cell made up of a single MOS transistor, FIGS. 10A and 10B show problems in operations, and FIGS. 11A to 11C show read operations (see, for example, J. Wan, L. Rojer, A. Zaslavsky, and S. Critoloveanu: "A Compact Capacitor-Less High-Speed DRAM Using Field Effect-Controlled Charge Regeneration," Electron Device Letters, Vol. 35, No. 2, pp. 179-181 (2012); T. Ohsawa, K. Fujita, T. Higashi, Y. Iwata, T. Kajiyama, Y. Asao, and K. Sunouchi: "Memory design using a one-transistor gain cell on SOI," IEEE JSSC, vol. 37, No. 11, pp 1510-1522 (2002); T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond," IEEE IEDM (2006); and E. Yoshida: "A Capacitorless 1T-DRAM Technology Using Gate-Induced Drain-Leakage (GIDL) Current for Low-Power and High-Speed Embedded Memory," IEEE IEDM (2006)). FIG. 9A shows a "1" written state. Here, the memory cell is formed on an SOI substrate 100, made up of a source $N^+$ layer 103 (hereinafter a semiconductor layer containing a high concentration of donor impurities will be referred to as an "$N^+$ layer") connected with a source line SL, a drain $N^+$ layer 104 connected with a bit line BL, a gate conductive layer 105 connected with a word line WL, and a floating body 102 of a MOS transistor 102. That is, a DRAM memory cell is made up of a single MOS transistor without a capacitor. Note that a $SiO_2$ layer 101 of the SOI substrate is placed in contact with an undersurface of the floating body 102. When "1" is written into the memory cell made up of the single MOS transistor, the MOS transistor is operated in a saturation region. That is, an electron channel 107 extending from the source $N^+$ layer 103 has a pinch-off point 108 and does not reach the drain $N^+$ layer 104 connected with a bit line. If the MOS transistor is operated with a gate voltage set to approximately ½ a drain voltage by applying high voltages to the bit line BL connected to the drain $N^+$ layer and the word line WL connected to the gate conductive layer 105 as described above, electric field strength is maximized at the pinch-off point 108 in the vicinity of the drain $N^+$ layer 104. As a result, accelerated electrons flowing from the source $N^+$ layer 103 towards the drain $N^+$ layer 104 collide with a Si lattice, and electron-hole pairs are created by kinetic energy lost at that moment. Most of the generated electrons (not shown) reach the drain $N^+$ layer 104. Only a few very hot electrons reach the gate conductive layer 105 by jumping over a gate oxide film 109. Positive holes 106 generated at the same time charge the floating body 102. In this case, the generated positive holes 106 contribute as an increment to majority carriers because the floating body 102 is made of p-type Si. The floating body 102 is filled with the generated positive holes 106, and if a voltage of the floating body 102 becomes higher than the source $N^+$ layer 103 by Vb or more, positive holes generated further are discharged to the source $N^+$ layer 103, where Vb is a built-in voltage of a pn junction between the source $N^+$ layer 103 and the floating body 102 in a p-layer, and is approximately 0.7 V. FIG. 9B shows how the floating body 102 is charged to saturation by the generated positive holes 106.

Next, a "0" writing operation of a memory cell 110 will be described using FIG. 9C. There are a memory cell 110 that writes "1" and a memory cell 110 that writes "0" randomly to a common select word line WL. FIG. 9C shows how a "1" written state is changed to a "0" written state. To write "0," the voltage of bit line BL is negatively biased and a pn junction between the drain N⁺ layer 104 and the floating body 102 in the p-layer is forward biased. As a result, positive holes 106 generated in the floating body 102 beforehand in the previous cycle flows to the drain N⁺ layer 104 connected to the bit line BL. Once the write operation finishes, two states of the memory cell follow: a state in which the memory cell 110 is filled with the generated positive holes 106 (FIG. 9B) and a state in which the generated positive holes are discharged from the memory cell 110 (FIG. 9C). The floating body 102 of the memory cell 110 filled with the positive holes 106 is higher in potential than the floating body 102 free of generated positive holes. Therefore, a threshold voltage of the memory cell 110 written with "1" is lower than a threshold voltage of the memory cell 110 written with "0." FIG. 9D shows how this looks like.

Next, problems in operations of the memory cell made up of a single MOS transistor will be described using FIGS. 10A and 10B. As shown in FIG. 10A, capacitance $C_{FB}$ of the floating body is the sum total of capacitance $C_{WL}$ between a gate connected with a word line and the floating body, junction capacitance $C_{SL}$ of a pn junction between the source N⁺ layer 103 connected with a source line and the floating body 102, and junction capacitance $C_{BL}$ of a pn junction between the drain N⁺ layer 104 connected with the bit line and the floating body 102; and is given by $$C_{FB}=C_{WL}+C_{BL}+C_{SL} \quad (8)$$

A capacitive coupling ratio WL between the gate connected with a word line and the floating body is given by $$\beta_{WL}=C_{WL}/(C_{WL}+C_{BL}+C_{SL}) \quad (9)$$

Therefore, if a word line voltage $V_{WL}$ swings during reading or writing, a voltage of the floating body 102 serving as a memory node (contact) of the memory cell is also affected. FIG. 10B shows how this looks like. If a word line voltage $V_{WL}$ rises from 0 V to $V_{WLH}$ during reading or writing, a voltage $V_{FE}$ of the floating body 102 rises from $V_{FB1}$ to $V_{FB2}$ due to capacitive coupling with the word line, where $V_{FB1}$ is an initial voltage before the word line voltage changes. The amount of change $\Delta V_{FB}$ in voltage is given by $$\Delta V_{FB}=V_{FB2}-V_{FB1}=\beta_{WL}\times V_{WLH} \quad (10)$$

In $\beta_{WL}$ in Eq. (9), a contribution ratio of $C_{WL}$ is large, and is expressed, for example, by $C_{WL}:C_{BL}:C_{SL}=8:1:1$. In this case, $\beta_{WL}=0.8$. If the word line, for example, is 5 V during writing and 0 V after the end of writing, due to capacitive coupling of the word line WL and floating body 102, the floating body 102 is subjected to amplitude noise as high as 5 V×$\beta_{WL}$=4 V. This poses a problem in that a sufficient margin of potential difference between a logic 1 potential and logic 0 potential of the floating body 102 cannot be secured during writing.

FIGS. 11A to 11C show a read operation, where FIG. 11A shows a "1" written state and FIG. 11B shows a "0" written state. Actually, however, even if Vb is written into the floating body 102 by writing of "1," if the word line returns to 0 V when the writing is finished, the floating body 102 is lowered to a negative bias. When "0" is being written, because the floating body 102 is negatively biased further, a sufficiently large margin of potential difference cannot be secured between "1" and "0" as shown in FIG. 11C, making it difficult to commercially introduce really capacitorless DRAM memory cells.

A capacitorless single-transistor DRAM (gain cell) has a problem in that there is large capacitive coupling between a word line and a floating body and if potential of the word line swings during data read or write, the swings are transmitted as noise to the floating body. This causes misreading or erroneous rewriting of storage data, making it difficult to put the capacitorless single-transistor DRAM (gain cell) to practical use.

SUMMARY OF THE INVENTION

To solve the above problem, a semiconductor element memory device according to the present invention comprises a block in which a plurality of semiconductor memory cells is arrayed in a matrix on a substrate, each of the semiconductor memory cells contained in the block in turn including: a semiconductor base body erected on a substrate in a vertical direction of the substrate or extended on the substrate in a horizontal direction, a first impurity region and a second impurity region provided on opposite ends of the semiconductor base body; a gate insulating layer placed in contact with a lateral surface of the semiconductor base body between the first impurity region and the second impurity region; a first gate conductor layer covering part or all of the gate insulating layer; and a second gate conductor layer located adjacent to the first gate conductor layer and placed in contact with a lateral surface of the gate insulating layer, wherein positive hole groups generated by an impact ionization phenomenon or by a gate-induced drain leakage current are held in the semiconductor base body by controlling voltages applied to the first gate conductor layer, the second gate conductor layer, the first impurity region, and the second impurity region, a memory write operation is performed by setting a voltage of the semiconductor base body to a first data retention voltage higher than a voltage of the first impurity region and/or the second impurity region by about a built-in voltage, a memory erase operation is performed by controlling voltages applied to the first impurity region, the second impurity region, the first gate conductor layer, and the second gate conductor layer and thereby extracting the positive hole groups from one or both of the first impurity region and the second impurity region, the voltage of the semiconductor base body is set to a second data retention voltage lower than the first data retention voltage, in the block, the first impurity region of each of the semiconductor memory cells is connected with a source line and the second impurity region is connected alternately with an odd-numbered bit line and an even-numbered bit line and one of the first and second gate conductor layers is connected with a word line and another is connected with a first drive control line, and in the block, using voltages applied to the source line, the bit lines, the first drive control line, and the word line, storage data of a plurality of the semiconductor base bodies selected by the word line is read alternately to the odd-numbered bit line and the even-numbered bit line (first aspect).

In the first aspect of the present invention, the storage data of the semiconductor base body is read alternately to the odd-numbered bit line and the even-numbered bit line and sense amplifier circuits alternately determine whether the storage data is write data or erase data (second aspect).

In the first aspect of the present invention, an operation of reading the storage data of the semiconductor base body through one of the odd-numbered bit line and the even-numbered bit line with another of the bit lines fixed to a first voltage and an operation of reading the storage data through the other of the bit lines with the one of the bit lines fixed to the first voltage are performed alternately (third aspect).

In the third aspect of the present invention, the first voltage is ground voltage (fourth aspect).

In the second aspect of the present invention, the odd-numbered bit line and the even-numbered bit line share one sense amplifier (fifth aspect).

In the second aspect of the present invention, the odd-numbered bit line is inputted to an odd-numbered sense amplifier circuit and the even-numbered bit line is inputted to an even-numbered sense amplifier circuit (sixth aspect).

In the first aspect of the present invention, the memory write operation is performed by selecting the odd-numbered bit line and the even-numbered bit line simultaneously (seventh aspect).

In the first aspect of the present invention, the memory write operation is performed by alternately selecting the odd-numbered bit line and the even-numbered bit line (eighth aspect).

In the first aspect of the present invention, the memory write operation is performed by alternating an operation of selecting one of the odd-numbered bit line and the even-numbered bit line with another of the bit lines fixed to a second voltage and an operation of selecting the other of the bit lines with the one of the bit lines fixed to the second voltage (ninth aspect).

In the first aspect of the present invention, first gate capacitance between the first gate conductor layer and the semiconductor base body is higher than second gate capacitance between the second gate conductor layer and the semiconductor base body (tenth aspect).

In the first aspect of the present invention, one or both of the first gate conductor layer and the second gate conductor layer are divided into two or more separate gate conductor layers in planar view or in a vertical direction and the separate gate conductor layers are operated synchronously or asynchronously (eleventh aspect).

In the eleventh aspect of the present invention, in the vertical direction, either the separate gate conductor layers of the first gate conductor layer are placed on opposite sides of the second gate conductor layer, or the separate gate conductor layers of the second gate conductor layer are placed on opposite sides of the first gate conductor layer (twelfth aspect).

BRIEF DESCRIPTION OF THE DRAWINGS

FIGS. 2A, 2B and 2C are diagrams explaining effects produced when gate capacitance of a first gate conductor layer 5a connected to a plate line PL of the memory device having the SGT according to the first embodiment is made higher than gate capacitance of a second gate conductor layer 5b connected with a word line WL;

FIGS. 3A, 3B, 3C and 3D are diagrams for explaining a write operation mechanism of the memory device having the SGT according to the first embodiment;

FIGS. 4AA, 4AB and 4AC are diagrams for explaining an erase operation mechanism of the memory device having the SGT according to the first embodiment;

FIG. 4B is a diagram for explaining the erase operation mechanism of the memory device having the SGT according to the first embodiment;

FIGS. 5A, 5B and 5C are diagrams for explaining a read operation mechanism of the memory device having the SGT according to the first embodiment;

FIG. 7 is a diagram for explaining the bit line shielding technique of a memory a device having an SGT according to a second embodiment;

FIGS. 9A, 9B, 9C and 9D are diagrams for explaining a write operation of a capacitorless DRAM memory cell according to a conventional example;

FIGS. 11A, 11B and 11C are diagrams for explaining a read operation of the capacitorless DRAM memory cell according to the conventional example.

DETAILED DESCRIPTION OF THE PREFERRED EMBODIMENTS

Embodiments of a memory device (hereinafter referred to as a dynamic flash memory), which uses a semiconductor element, according to the present invention will be described below with reference to the drawings.

First Embodiment

A structure and operation mechanism of a dynamic flash memory cell according to a first embodiment of the present invention will be described below using FIGS. 1 to 6C. The structure of the dynamic flash memory cell will be described using FIG. 1. Then, using FIGS. 2A to 2C, description will be given of effects produced when gate capacitance of a first gate conductor layer 5a connected to a plate line PL is made higher than gate capacitance of a second gate conductor layer 5b connected with a word line WL. Then, a data write operation mechanism will be described using FIGS. 3A to 3D, a data erase operation mechanism will be described using FIGS. 4AA to 4B, and a data read operation mechanism will be described using FIGS. 5A to 5C.

Figure 1:
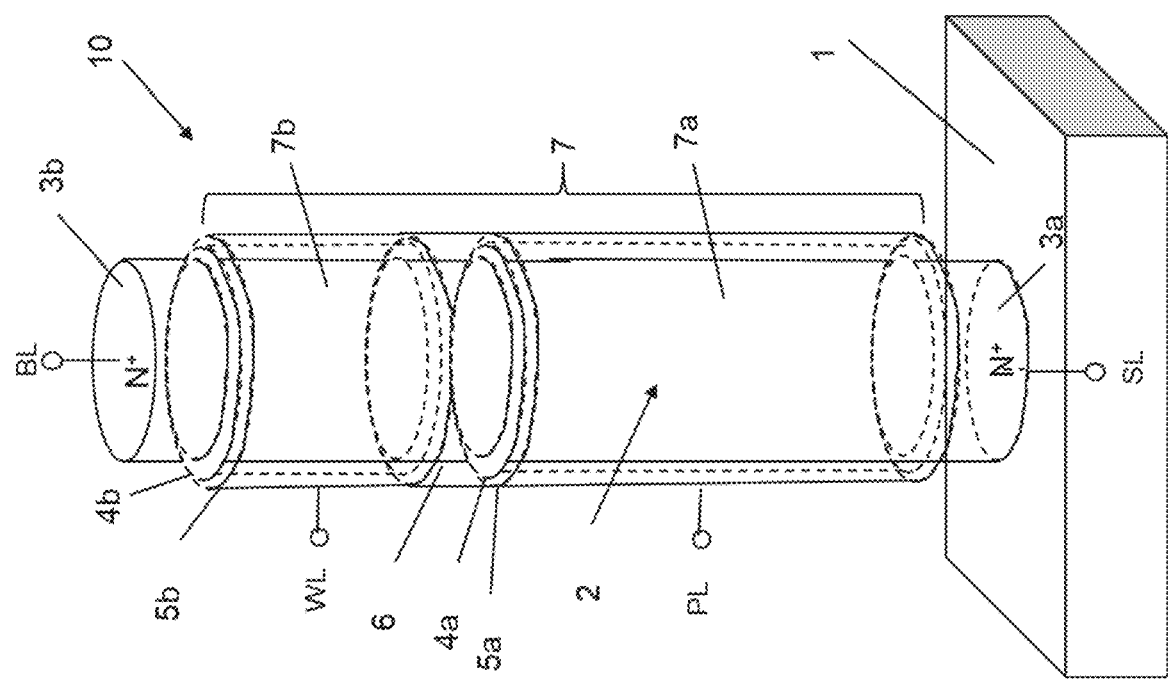
FIG. 1 is a structural diagram of a memory device having an SGT according to a first embodiment.

The structure of the dynamic flash memory cell according to the first embodiment of the present invention is shown in FIG. 1. N$^+$ layers 3a and 3b (which are examples of a "first impurity region" and a "second impurity region" described in Claims), one of which serves as a source while the other serves as a drain, are formed at upper and lower positions in a silicon semiconductor pillar 2 (which is an example of a "semiconductor base body" described in Claims, and will be referred to hereinafter as a "Si pillar") formed on a substrate 1 (which is an example of a "substrate" described in Claims) and having a P or i conductivity type (intrinsic type). That part of the Si pillar 2 which is between the N$^+$ layers 3a and 3b that serve as the source and the drain is a semiconductor base body 7. A first gate insulating layer 4a (which is an example of a "first gate insulating layer" described in Claims) and a second gate insulating layer 4b (which is an example of a "second gate insulating layer" described in Claims) are formed by surrounding the semiconductor base body 7. The first gate insulating layer 4a and the second gate insulating layer 4b are placed, respectively, in contact with, or close to, the N⁺ layers 3a and 3b that serve as the source and the drain. The first gate conductor layer 5a (which is an example of a "first gate conductor layer" described in Claims) and the second gate conductor layer 5b (which is an example of a "second gate conductor layer" described in Claims) are formed by surrounding the first gate insulating layer 4a and the second gate insulating layer 4b, respectively. The first gate conductor layer 5a and the second gate conductor layer 5b are separated by an insulating layer 6 (which is an example of a "first insulating layer" described in Claims). The semiconductor base body 7 (which is an example of a "semiconductor base body" described in Claims), which is that part of the Si pillar 2 which is between the N⁺ layers 3a and 3b, is made up of a first channel Si layer 7a surrounded by the first gate insulating layer 4a (which is an example of a "first semiconductor base body" described in Claims) and a second channel Si layer 7b (which is an example of a "second semiconductor base body" described in Claims) surrounded by the second gate insulating layer 4b. This results in formation of a dynamic flash memory cell 10 made up of the N⁺ layers 3a and 3b, which are to become the source and the drain, the semiconductor base body 7, the first gate insulating layer 4a, the second gate insulating layer 4b, the first gate conductor layer 5a, and the second gate conductor layer 5b. Then, the N⁺ layer 3a to become the source is connected to the source line SL (which is an example of a "source line" described in Claims), the N⁺ layer 3b to become the drain is connected to the bit line BL (which is an example of a "bit line" described in Claims), the first gate conductor layer 5a is connected to the plate line PL which is a first drive control line (which is an example of a "first drive control line" described in Claims), and the second gate conductor layer 5b is connected to the word line WL (which is an example of a "word line" described in Claims). Desirably the gate capacitance of the first gate conductor layer 5a connected with the plate line PL is structured to be higher than the gate capacitance of the second gate conductor layer 5b connected with the word line WL.

Note that in FIG. 1, the first gate conductor layer 5a is made larger in gate length than the second gate conductor layer 5b such that the first gate conductor layer 5a connected to the plate line PL will be higher in gate capacitance than the second gate conductor layer 5b connected with the word line WL. In addition, however, instead of making the first gate conductor layer 5a larger in gate length than the second gate conductor layer 5b, film thicknesses of the gate insulating layers may be changed such that a gate insulating film of the first gate insulating layer 4a will be smaller in film thickness than a gate insulating film of the second gate insulating layer 4b. Also, materials of the gate insulating layers may be varied in permittivity such that the gate insulating film of the first gate insulating layer 4a will be higher in permittivity than the gate insulating film of the second gate insulating layer 4b. Besides, the first gate conductor layer 5a connected to the plate line PL may be made higher in gate capacitance than the second gate conductor layer 5b connected with the word line WL by combining any of the following: lengths of the gate conductor layers 5a and 5b, and film thicknesses and permittivities of the gate insulating layers 4a and 4b.

FIGS. 2A to 2C are diagrams explaining effects produced when the gate capacitance of the first gate conductor layer 5a connected to the plate line PL is made higher than the gate capacitance of the second gate conductor layer 5b connected with the word line WL.

FIG. 2A shows only main part of the dynamic flash memory cell according to the first embodiment of the present invention in a simplified manner. The dynamic flash memory cell is connected with the bit line BL, the word line WL, the plate line PL, and the source line SL, whose voltage states determine a potential state of the semiconductor base body 7.

FIG. 2B is a diagram for explaining relationships among capacitances. Capacitance $C_{FB}$ of the semiconductor base body 7 is the sum total of capacitance $C_{WL}$ between the gate 5b connected with the word line WL and the semiconductor base body 7, capacitance $C_{PL}$ between the gate 5a connected with the plate line PL and the semiconductor base body 7, junction capacitance $C_{SL}$ of a pn junction between the source N⁺ layer 3a connected with the source line SL and the semiconductor base body 7, and junction capacitance $C_{BL}$ of a pn junction between the drain N⁺ layer 3b connected with the bit line BL and the semiconductor base body 7, and is given by $$C_{FB}=C_{WL}+C_{PL}+C_{BL}+C_{SL} \quad (1)$$

Therefore, a coupling ratio $\beta_{WL}$ between the word line WL and the semiconductor base body 7, a coupling ratio $\beta_{PL}$ between the plate line PL and the semiconductor base body 7, a coupling ratio $\beta_{PL}$ between the bit line BL and the semiconductor base body 7, and a coupling ratio $\beta_{SL}$ between the source line SL and the semiconductor base body 7 are given, respectively, by $$\beta_{WL}=C_{WL}/(C_{WL}+C_{PL}+C_{BL}+C_{SL}) \quad (2)$$

$$\beta_{PL}=C_{PL}/(C_{WL}+C_{PL}+C_{BL}+C_{SL}) \quad (3)$$

$$\beta_{BL}=C_{BL}/(C_{WL}+C_{PL}+C_{BL}+C_{SL}) \quad (4) \text{ and}$$

$$\beta_{SL}=C_{SL}/(C_{WL}+C_{PL}+C_{BL}+C_{SL}) \quad (5),$$

where $C_{PL}>C_{WL}$, $\beta_{PL}>\beta_{WL}$.

FIG. 2C is a diagram for explaining changes of a voltage $V_{FB}$ in the semiconductor base body 7 when a Voltage $V_{WL}$ of the word line WL rises during read and write operations and falls subsequently. Here, when the voltage $V_{WL}$ of the word line WL rises from 0 V to a high-voltage state and the voltage $V_{FB}$ of the semiconductor base body 7 changes from a low-voltage state $V_{FBL}$ to a high-voltage state $V_{FBH}$, a potential difference $\Delta V_{FB}$ is given by $$\Delta V_{FB}=V_{FBH}-V_{FBL}=\beta_{WL}+V_{WLH} \quad (6)$$

Because the coupling ratio $\beta_{WL}$ between the word line WL and the semiconductor base body 7 is low and the coupling ratio $\beta_{PL}$ between the plate line PL and the semiconductor base body 7 is high, $\Delta V_{FB}$ is low and even if the voltage $V_{WL}$ of the word line WL rises and falls during read and write operations, the voltage $V_{FB}$ of the semiconductor base body 7 almost does not change.

A write operation of the dynamic flash memory cell according to the first embodiment of the present invention is shown in FIGS. 3A to 3D. FIG. 3A shows a mechanism of the write operation and FIG. 3B shows operation waveforms of the bit line BL, source line SL, plate line PL, word line WL, and semiconductor base body 7, which is indicated as the floating body FB. At time T0, the dynamic flash memory cell is in a "0" erased state and the voltage of the semiconductor base body 7 is $V_{FB}$ "0." Besides, Vss is applied to the bit line BL, the source line SL, and the word line WL while $V_{PLL}$ is applied to the plate line PL. Here, for example, Vss is 0 V and $V_{PLL}$ is 2 V. Next, from time T1 to time T2, when the bit line BL rises from Vss to $V_{BLH}$, for example, if Vss is 0 V, the voltage of the semiconductor base body 7 becomes $V_{FB}$ "0"+$\beta_{BL} \times V_{BLH}$ as a result of capacitive coupling between the bit line BL and the semiconductor base body 7.

Next, a write operation of the dynamic flash memory cell will be described using FIGS. 3A and 3B. From time T3 to time T4, the voltage of the word line WL rises from Vss to $V_{WLH}$. Consequently, when the second gate conductor layer 5*b* connected with the word line WL sets a "0" erasing threshold voltage of a second n-channel MOS transistor region surrounding the semiconductor base body 7 to $Vt_{WL}$ "0," as the voltage of the word line WL rises, from Vss to $Vt_{WL}$ "0," the voltage of the semiconductor base body 7 becomes $V_{FB}$ "0"+$\beta_{BL} \times V_{BLH}$+$\beta_{WL} \times Vt_{WL}$ "0" as a result of second capacitive coupling (which is an example of a "second capacitive coupling" described in Claims) between the word line WL and the semiconductor base body 7. If the voltage of the word line WL rises to or above $Vt_{WL}$ "0," an annular inversion layer 12*b* is formed in the semiconductor base body 7 inside the second gate conductor layer 5*b*, blocking the second capacitive coupling between the word line WL and the semiconductor base body 7.

Description of the write operation of the dynamic flash memory cell will be continued using FIGS. 3A and 3B. From time T3 to time T4, for example, $V_{PLL}$=2 V is inputted constantly to the first gate conductor layer 5*a* connected with the plate line PL, raising the second gate conductor layer 5*b* connected with the word line WL to, for example, $V_{WLH}$=4 V. Consequently, as shown in FIG. 3A, an inversion layer 12*a* is formed on the semiconductor base body 7 inside the first gate conductor layer 5*a* connected with the plate line PL, with a pinch-off point 13 existing in the inversion layer 12*a*. As a result, a first n-channel MOS transistor region having the first gate conductor layer 5*a* operates in a saturation region. On the other hand, the second n-channel MOS transistor region having the second gate conductor layer 5*b* that is connected with the word line WL operates in a linear region. As a result, no pinch-off point exists in the semiconductor base body 7 on the inner circumference of the second gate conductor layer 5*b* connected with the word line WL, and an inversion layer 12*b* is formed on the entire surface. The inversion layer 12*b* formed on the entire inner circumference of the second gate conductor layer 5*b* connected with the word line WL operates as a practical drain of the second n-channel MOS transistor region having the second gate conductor layer 5*b*. As a result, an electric field is maximized and an impact ionization phenomenon occurs in a first boundary region of the semiconductor base body 7 between the first n-channel MOS transistor region having the first gate conductor layer 5*a* that is connected in series and the second n-channel MOS transistor region having the second gate conductor layer 5*b*. The first boundary region is a source-side region as viewed from the second n-channel MOS transistor region having the second gate conductor layer 5*b* that is connected with the word line WL, and thus the phenomenon is called a source-side impact ionization phenomenon. As a result of the source-side impact ionization phenomenon, electrons flow from the N⁺ layer 3*a* connected with the source line SL toward the N⁺ layer 3*b* connected with the bit line. Accelerated electrons collide with Si lattice atoms and electron-hole pairs are created by kinetic energy of the accelerated electrons. Part of the generated electrons flows to the first gate conductor layer 5*a* and the second gate conductor layer 5*b*, but most of the electrons flow to the N⁺ layer 3*b* connected to the bit line BL (not shown).

As shown in FIG. 3C, generated positive hole groups 9 (which are examples of a "positive hole group" described in Claims) are majority carriers in the semiconductor base body 7 and charge the semiconductor base body 7 so as to be positively biased. The N⁺ layer 3*a* connected with the source line SL is 0 V and thus the semiconductor base body 7 is charged to a built-in voltage Vb (approximately 0.7 V) of a pn junction between the N⁺ layer 3*a* connected with the source line SL and the semiconductor base body 7. Once the semiconductor base body 7 is charged to be positively biased, threshold voltages of the first n-channel MOS transistor region and second n-channel MOS transistor region fall due to a substrate bias effect.

Description of the write operation of the dynamic flash memory cell will be continued using FIG. 3B. From time T6 to time T7, the voltage of the word line WL drops from $V_{WLH}$ to Vss. In so doing, the word line WL and the semiconductor base body 7 form second capacitive coupling, but until the voltage $V_{WLH}$ of the word line WL becomes equal to or lower than the threshold voltage $Vt_{WL}$ "1" of the second n-channel MOS transistor region when the voltage of the semiconductor base body 7 is Vb, the inversion layer 12*b* blocks the second capacitive coupling. Therefore, practical capacitive coupling between the word line WL and the semiconductor base body 7 is enabled only when the word line WL becomes equal to or lower than $Vt_{WL}$ "1" and falls to Vss. As a result, the voltage of the semiconductor base body 7 becomes Vb−$\beta_{WL} \times Vt_{WL}$ "1." Here, $Vt_{WL}$ "1" is lower than $Vt_{WL}$ "0" described above, and thus $\beta_{WL} \times Vt_{WL}$ "1" is low.

Description of the write operation of the dynamic flash memory cell will be continued using FIG. 3B. From time T8 to time T9, the bit line BL drops from $V_{BLH}$ to Vss. Since the bit line BL and the semiconductor base body 7 are capacitively coupled, eventually "1"-writing voltage $V_{FB}$ "1" of the semiconductor base body 7 becomes as follows.

$$V_{FB}\text{"1"}=Vb-\beta_{WL} \times Vt_{WL}\text{"1"}-\beta_{BL} \times V_{BLH} \tag{7}$$

where the coupling ratio $\beta_{BL}$ between the bit line BL and the semiconductor base body 7 is also low. Consequently, as shown in FIG. 3D, the threshold voltage of the second n-channel MOS transistor region of a second channel Si layer 7*b* connected with the word line WL becomes low. A "1" written state of the semiconductor base body 7 is set to a first data retention voltage (which is an example of a "first data retention voltage" described in Claims). A memory write operation (which is an example of a "memory write operation" described in Claims) is performed and this state is assigned to logical storage data "1."

Note that in the write operation, electron-hole pairs may be generated by an impact ionization phenomenon in a second boundary region between the N⁺ layer (first impurity region) 3*a* and the first channel Si layer (first semiconductor base body) 7*a*, or in a third boundary region between the N⁺ layer (second impurity region) 3*b* and the second channel Si layer (second semiconductor base body) 7*b*, rather than in the first boundary region, and the semiconductor base body 7 may be charged with the generated positive hole groups 9.

A memory erase operation (which is an example of a "memory erase operation" described in Claims) mechanism is described in FIGS. 4AA, 4AB, 4AC and 4B. The semiconductor base body 7 between the N⁺ layers 3*a* and 3*b* is electrically separated from the substrate, making up a floating body. FIG. 4AA shows that before the erase operation, the positive hole groups 9 generated by impact ionization in the previous cycle are stored in the semiconductor base body 7. As shown in FIG. 4AB, during an erase operation, the voltage of the source line SL is set to a negative voltage $V_{ERA}$. Here, $V_{ERA}$ is, for example, −3 V. Consequently, regardless of the value of an initial potential of the semiconductor base body 7, the pn junction between the N+ layer 3a connected with the source line SL to serve as a source and the semiconductor base body 7 becomes forward-biased. As a result, the positive hole groups 9 generated by impact ionization in the previous cycle and stored in the semiconductor base body 7 are drawn into the N+ layer 3a in a source area, a potential $V_{FB}$ of the semiconductor base body 7 becomes $V_{FB}=V_{ERA}+Vb$, and the resulting voltage value becomes a second data retention voltage (which is an example of a "second data retention voltage" described in Claims). Here, Vb is the built-in voltage of the pn junction and is approximately 0.7 V. Therefore, when $V_{ERA}=-3$ V, the potential of the semiconductor base body 7 becomes −2.3 V. This value is the potential state of the semiconductor base body 7 in an erased state. Therefore, when a potential of the semiconductor base body 7 of the floating body becomes a negative voltage, the threshold voltage of the second n-channel MOS transistor region increases due to the substrate bias effect. Consequently, as shown in FIG. 4AC, a threshold voltage of the second gate conductor layer 5b connected with the word line WL increases. The erased state of the semiconductor base body 7 turns to "0" of logical storage data. During the data read, if the voltage to be applied to the first gate conductor layer 5a joined to the plate line PL is set higher than the threshold voltage at a time when the logical storage data is "1" and lower than the threshold voltage at a time when the logical storage data is "0," the property that no current flows even if the voltage of the word line WL is increased is obtained. Note that an example of voltage conditions for major node contacts during the erase operation is shown FIG. 4B.

FIGS. 5A to 5C are diagrams for explaining a read operation of the dynamic flash memory cell according to the first embodiment of the present invention. As shown in FIG. 5A, when the semiconductor base body 7 is charged to the built-in voltage Vb (approximately 0.7 V), the threshold voltage of the second n-channel MOS transistor region having the second gate conductor layer 5b that is connected with the word line WL drops due to the substrate bias effect. This state is assigned to logical storage data "1." As shown in FIG. 5B, a memory block selected before a write is set to an erased state "0" in advance and the voltage $V_{FB}$ of the semiconductor base body 7 is $V_{FB}$ "0." As a result of write operations, a written state "1" is stored randomly. As a result, logical storage data of logic "0" and logic "1" is created for the word line WL. As shown in FIG. 5C, using a height difference between two threshold voltages for the word line WL, reading is done by a sense amplifier.

Figure 6A:
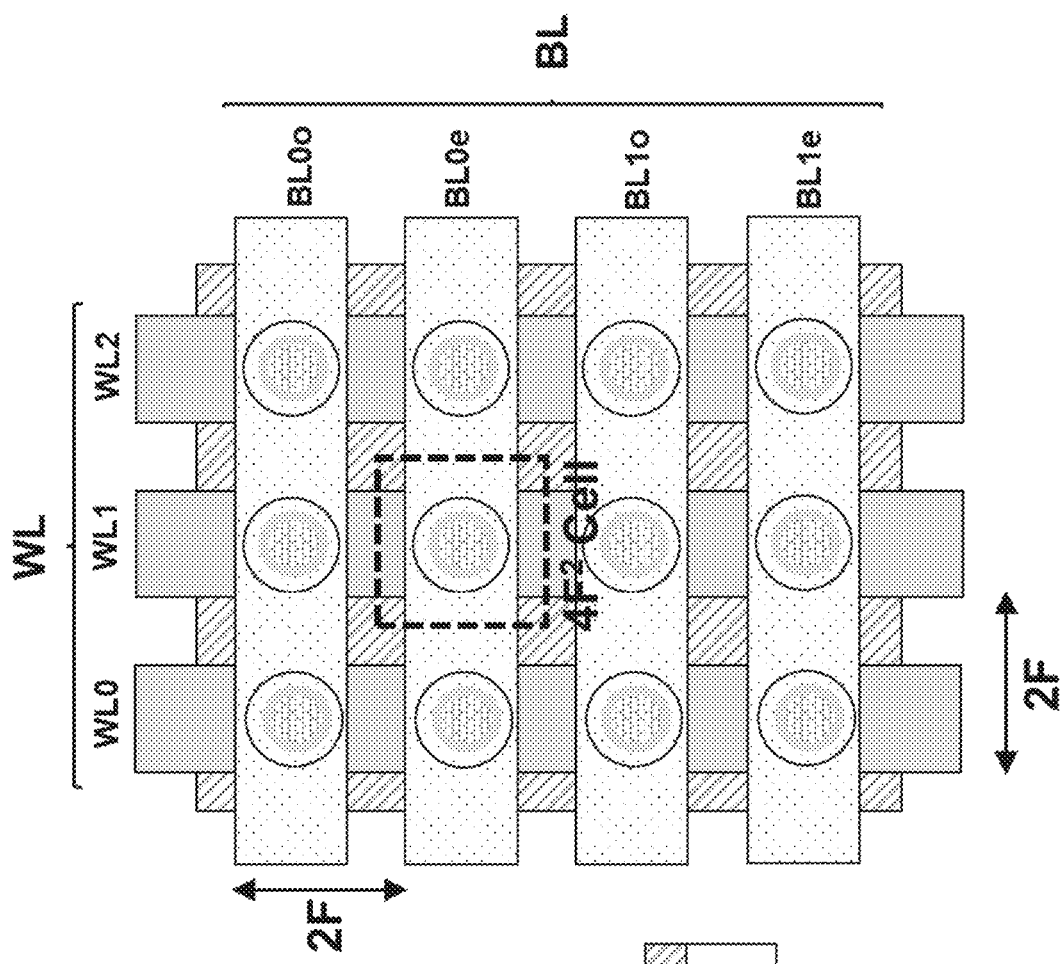
FIGS. 6AA, 6AB and 6AC are diagrams for explaining bit line shielding technique of the memory device having the SGT according to the first embodiment.
Figure 6A:
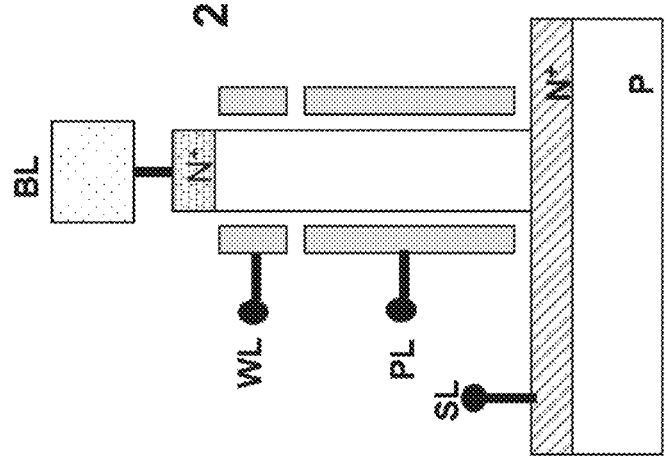
Figure 6A:
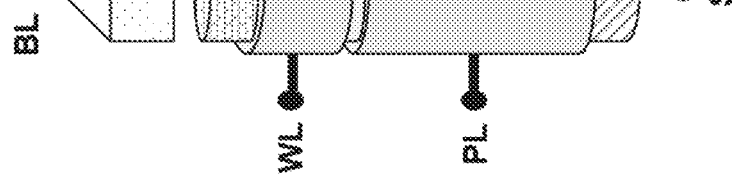

FIGS. 6AA to 6C are diagrams for explaining a bit line shielding technique of a dynamic flash memory cell according to the first embodiment of the present invention.

A bird's-eye view and sectional view of a 1-bit dynamic flash memory cell made up of one piece of semiconductor base material are shown, respectively, in FIGS. 6AA and 6AB. In FIGS. 6AA and 6AB, the dynamic flash memory cell is connected with the bit line BL, the source line SL, the plate line PL, and the word line WL. FIG. 6AC shows a plan view of a block (which is an example of a "block" described in Claims) in which multiple, namely, 3×4, dynamic flash memory cells are arrayed in a matrix (which is an example of "a plurality of . . . in a matrix" described in Claims). The dynamic flash memory cells can be arrayed by setting the pitch of the bit lines BL to 2F, the pitch of the word lines WL to 2F, and the 1-bit memory cell size to 2F×2F=4F², where F is feature size, which is one of design rules or ground rules. In a miniaturized dynamic flash memory cell, for example, F=15 nm. As a result, when adjacent bit lines BL read "1" written memory cells and "0" erased memory cells, capacitive coupling among the bit lines is strong, which requires ingenuity in a reading method. Although there are descriptions of the use of a bit line shielding technique for non-volatile memories (see, for example, T. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and High Speed Switching of Ti-doped NiO ReRAM under the Unipolar Voltage Source of less than 3V," IEDM (2007)), there has been no description of the use of the bit line shielding technique for volatile memories.

Figure 6B:
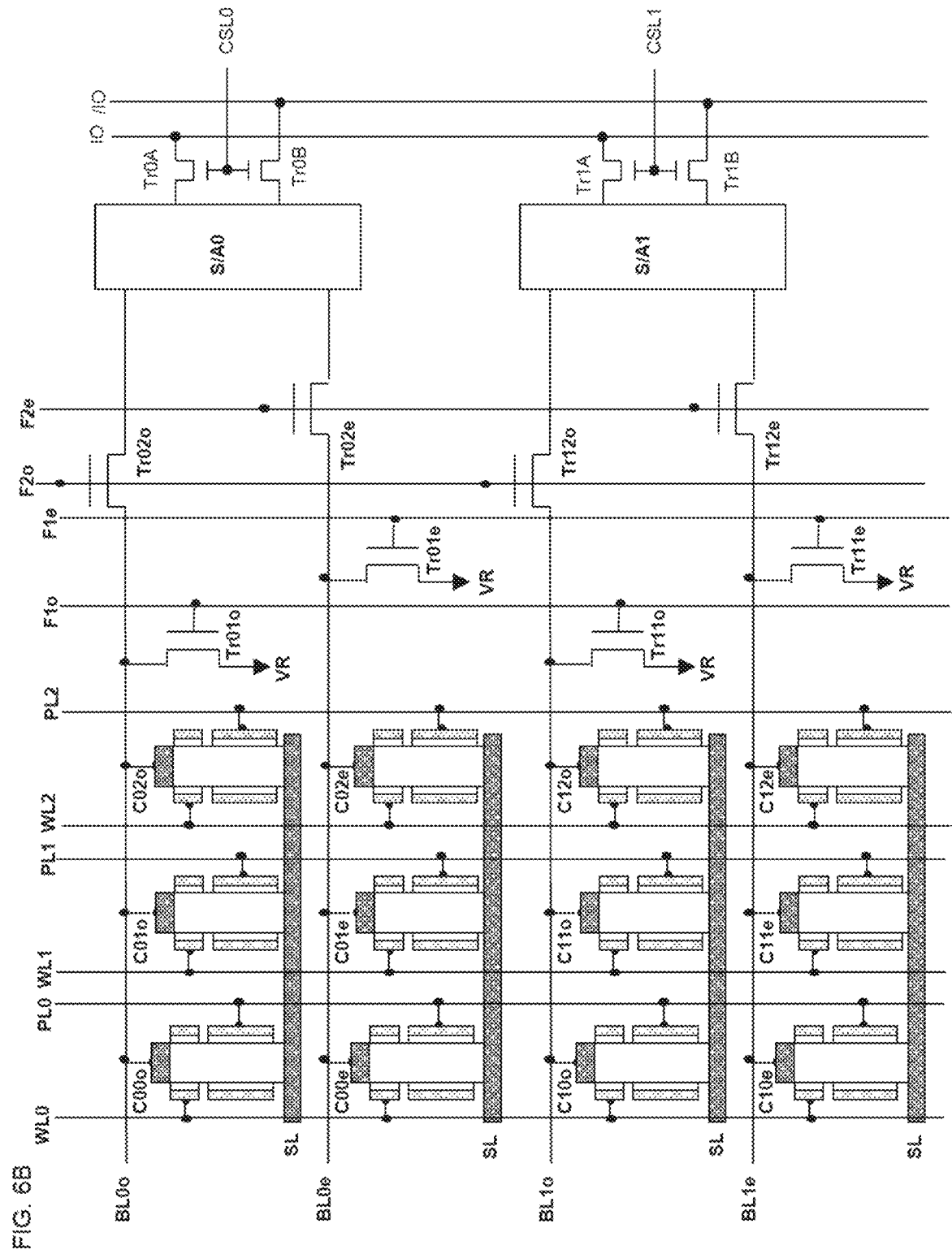
FIG. 6B is a diagram for explaining the bit line shielding technique of the memory device having the SGT according to the first embodiment.

FIG. 6B shows a circuit block diagram of a block in which 3×4 dynamic flash memory cells shown in FIG. 6AC are arrayed in a matrix. Now a read operation will be described with reference to FIG. 6B. Odd-numbered bit lines (which are an example of an "odd-numbered bit line" described in Claims) BL0o and BL1o, are connected, respectively, with memory cells C00o to C02o and C10o to C12o, and even-numbered bit lines (which are an example of an even-numbered bit line" described in Claims) BL0e and BL1e are connected, respectively, with memory cells C00e to C02e and C10e to C12e. Word lines WL0 to WL2 and plate lines PL0 to P12 are commonly connected to memory cells connected to even-numbered bit lines and memory cells connected to odd-numbered bit lines. Here, description will be given of a case in which, for example, the word line WL0 and the plate line PL0 are selected. First, an odd-number control line F1o is inputted to gates of transistors Tr01o and Tr11o, even-numbered bit lines BL0e and BL1e are selected, and while storage data (which is an example of "storage data" described in Claims) in the memory cells C00e and C10e are read to the even-numbered bit lines BL0e and BL1e, odd-numbered bit lines BL0o and BL1o remain fixed to a first voltage (which is an example of a "first voltage" described in Claims) VR. Here VR denotes ground voltage (which is an example of "ground voltage" described in Claims), which is, for example, 0 V. Then, an even-number selection line F2e is inputted to gates of transistors Tr02e and Tr12e, and the even-numbered bit lines BL0e and BL1e are connected, respectively, to sense amplifier circuits (which are an example of a "sense amplifier circuit" described in Claims) S/A0 and S/A1. When column selection lines CSL0 and CSL1 are inputted, data read to the sense amplifier circuits S/A0 and S/A1 is read in sequence to input-output lines I/O and /I/O via transistors Tr0A, Tr0B, Tr1A, and Tr1B.

Description of the read operation will be continued using FIG. 6B, which is a circuit block diagram of a block in which 3×4 dynamic flash memory cells are arrayed in a matrix. Next, an even-number control line F1e is inputted to gates of transistors Tr01e and Tr11e, odd-numbered bit lines BL0o and BL1o are selected, and while storage data in the memory cells are read to the odd-numbered bit lines BL0o and BL1o, the even-numbered bit lines BL0e and BL1e remain fixed to the first voltage VR. Then, an odd-number selection line F2o is inputted to gates of transistors Tr02o and Tr12o and the odd-numbered bit lines BL0o and BL1o are connected, respectively, to the sense amplifier circuits S/A0 and S/A1. When the column selection lines CSL0 and CSL1 are inputted, data read to the sense amplifier circuits S/A0 and S/A1 is read in sequence to the input-output lines I/O and /I/O via the transistors Tr0A, Tr01B, Tr1A, and Tr1B.

In this way, after the memory cells C00e and C10e are read to the even-numbered bit lines BL0e and BL1e, the memory cells C00o to C10o are read to the odd-numbered bit lines BL0*o* and BL1*o*. The sense amplifier circuit S/A0 is shared by the odd-numbered bit line BL0*o* and the even-numbered bit line BL0*e* while the sense amplifier circuit S/A1 shared by the odd-numbered bit line BL1*o* and the even-numbered bit line BL1*e*. This makes it possible to reduce the number of sense amplifier circuits in the memory array by half, reduce chip size accordingly, and thereby provide an inexpensive memory device. The reason why, the dynamic flash memory cells can ground even-numbered bit lines and odd-numbered bit lines alternately during reading in spite of being volatile memories is that advantages of non-destructive read-out memory cells are exploited. That is, even if an arbitrary word line WL is selected, ensuring that storage data in the memory cell can be read to a bit line BL, and the bit line is grounded; the storage data in the memory cell does not become corrupted and read data can be read stably to one of bit lines, i.e., a selected bit line, with noise reduced by the other bit line, i.e., a shielded bit line.

A "1" writing operation will be described using FIG. 6C, which is a circuit block diagram of a block in which 3×4 dynamic flash memory cells are arrayed in a matrix. Before "1" writing, all the memory cells C00*o* to C02*o*, C10*o* to C12*o*, C00*e* to C02*e*, and C10*e* to C12*e* in the block have been erased by an erase method descried, for example, in FIGS. 4AA, 4AB, 4AC and 4B. Here, description will be given of a case in which, for example, the word line WL0 and the, plate line PL0 are selected. First, when the column selection lines CSL0 and CSL1 are inputted through the input-output lines I/O and /I/O, data is loaded into the sense amplifier circuits S/A0 and S/A1 in sequence via the transistors Tr0A, Tr0B, Tr1A, and Tr1B. Next, the even-number selection line F2*e* is inputted to the gates of the transistors Tr02*e* and Tr12*e*, and the even-numbered bit lines BL0*e* and BL1*e* are connected, respectively, to the sense amplifier circuits S/A0 and S/A1. Then, the odd-number control line F1*o* is inputted to the gates of the transistors Tr01*o* and Tr11*o*, and while a "1" writing operation is being performed with respect to the memory cells C00*e* and C10*e* via the even-numbered bit lines BL0*e* and BL1*e*, the odd-numbered bit lines BL0*o* and BL1*o* remain fixed to a second voltage (which is an example of a "second voltage" described in Claims) VW, which is, for example, 0 V.

Figure 6C:
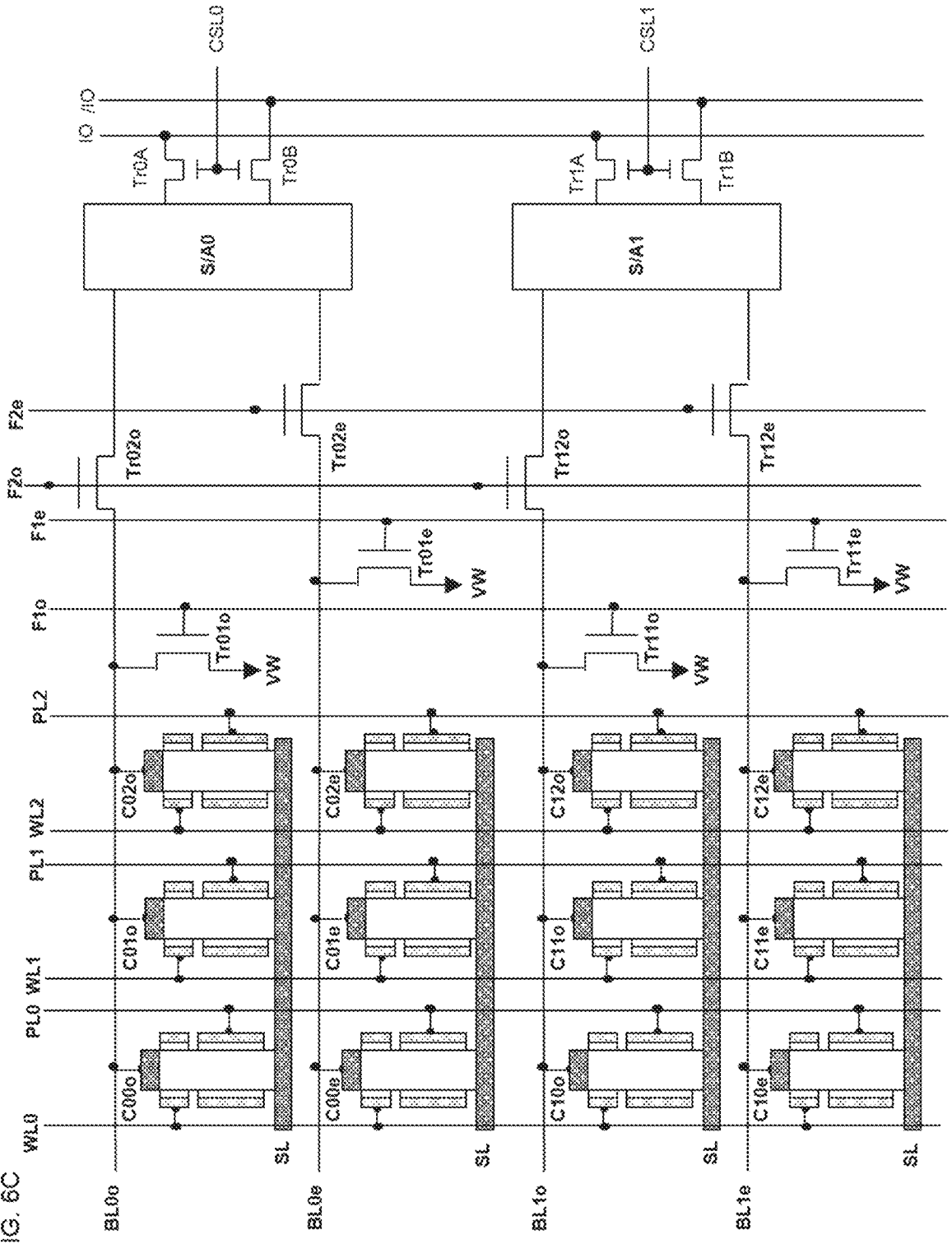
FIG. 6C is a diagram for explaining the bit line shielding technique of the memory device having the SGT according to the first embodiment.

Description of the "1" writing operation will be continued using FIG. 6C, which is a circuit block diagram of a block in which 3×4 dynamic flash memory cells are arrayed in a matrix. Again, when the column selection lines CSL0 and CSL1 are inputted through the input-output lines I/O and /I/O, data is loaded into the sense amplifier circuits S/A0 and S/A1 in sequence via the transistors Tr0A, Tr0B, Tr1A, and Tr1B. Next, the odd-number selection line F2*o* is inputted to the gates of the transistors Tr02*o* and Tr12*o* and the odd-numbered bit lines BL0*o* and BL1*o* are connected, respectively, to the sense amplifier circuits S/A0 and S/A1. Then, the even-number control line F1*e* is inputted to the gates of the transistors Tr01*e* and Tr11*e*, and while a "1" writing operation is being performed with respect to the memory cells C00*o* and C10*o* via the odd-numbered bit lines BL0*o* and BL1*o*, the even-numbered bit lines BL0*e* and BL1*e* remain fixed to the second voltage VW.

In this way, regarding the "1" writing operation, again, by selecting even-numbered bit lines and odd-numbered bit lines alternately, the "1" writing operation can be performed with respect to the memory cells connected to the bit lines. The reason is that if a bit line connected to a memory cell kept in an erased state is sandwiched between bit lines undergoing a "1" writing operation, the memory cell will be affected by noise caused by capacitive coupling between the adjacent bit lines. The sense amplifier circuit. S/A0 is shared by the odd-numbered bit line BL0*o* and the even-numbered bit line BL0*e* while the sense amplifier circuit S/A1 is shared by the odd-numbered bit line BL1*o* and the even-numbered bit line BL1*e*. This makes it possible to reduce the number of sense amplifier circuits in the block by half, reduce chip size accordingly, and thereby provide an inexpensive memory device.

Note that in FIG. 1, desirably vertical length of the first gate conductor layer 5*a* connected with the plate line PL is made still larger than vertical length of the first gate conductor layer 5*b* connected with the word line WL such that $C_{PL} > C_{WL}$. However, by merely adding the plate line PL, a capacitive coupling ratio $(C_{WL}/(C_{PL}+C_{WL}+C_{BL}+C_{SL}))$ of the word line WL to the semiconductor base body 7 is reduced. This reduces a potential fluctuation $\Delta V_{FB}$ in the semiconductor base body 7 of the floating body.

Besides, as the voltage $V_{PLL}$ of the plate line PL, a fixed voltage of, for example, 2 V may be applied in operation modes other than those erased selectively in block erase operations.

In FIG. 1, operation of the dynamic flash memory described in the present embodiment can be performed even if a horizontal sectional shape of the Si pillar 2 is circular, elliptical, or rectangular. Besides, circular, elliptical, and rectangular dynamic flash memory cells may be allowed to coexist on a same chip.

Besides, in FIG. 1, the first gate conductor layer 5*a* may be connected to the word line WL and the second gate conductor layer 5*b* may be connected to the plate line PL. This also enables the present dynamic flash memory operation described above.

In FIG. 1, a dynamic flash memory element has been described by taking as an example an SGT that includes the first gate insulating layer 4*a* surrounding an entire lateral surface of the Si pillar 2 erected in a vertical direction on the substrate 1, the second gate insulating layer 4*b*, and the first gate conductor layer 5*a* and second gate conductor layer 5*b* surrounding the entire first gate insulating layer 4*a* and second gate insulating layer 4*b*, respectively. As indicated in the description of the present embodiment, it is sufficient if the present dynamic flash memory element is structured to satisfy the condition that the positive hole groups 9 generated by the impact ionization phenomenon are held in the semiconductor base body 7. For that, it is sufficient that the semiconductor base body 7 has a floating body structure separated from the substrate 1. Consequently, the above-mentioned operation of the dynamic flash memory can be performed using, for example, GAA (Gate All Around; see, for example, E. Yoshida: "A Capacitorless 1T-DRAM Technology Using Gate-Induced Drain-Leakage (GIDL) Current for Low-Power and High-Speed Embedded Memory," IEEE IEDM (2006)) technology, which is one of SGTs, or Nanosheet technology (see, for example, J. Y. Song, W. Y. Choi, J. H. Park, J. D. Lee, and B-G. Park: "Design Optimization of Gate-All-Around(GAA)MOSFETs," IEEE Trans. Electron Devices, vol. 5, no. 3, pp. 186-191, May 2006), even if the semiconductor base body of the semiconductor base body is formed horizontally to the substrate 1. A device structure (see, for example, J. Wan, L. Rojer, A. Zaslavsky, and S. Critoloveanu: "A Compact Capacitor-Less High-Speed DRAM Using Field Effect-Controlled Charge Regeneration," Electron Device Letters, Vol. 35, No. 2, pp. 179-181 (2012); T. Ohsawa, K. Fujita, T. Higashi, Y. Iwata, T. Kajiyama, Y. Asao, and K. Sunouchi: "Memory design using a one-transistor gain cell on SOI," IEEE JSSC, vol. 37, No. 11, pp 1510-1522 (2002); T. Shino, N. Kusunoki, T.

Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond," IEEE IEDM (2006); E. Yoshida: "A Capacitorless 1T-DRAM Technology Using Gate-Induced Drain-Leakage (GIDL) Current for Low-Power and High-Speed Embedded Memory," IEEE IEDM (206)) that uses SOI (Silicon On Insulator) may also be used. In this device structure, a bottom of a semiconductor base body is in contact with an insulating layer of an SOI substrate and surrounds other semiconductor base bodies while being surrounded by a gate insulating layer and an element separating insulating layer. In this structure, again the semiconductor base body has a floating body structure. In this way, it is sufficient if the dynamic flash memory element provided by the present embodiment satisfies the condition that the semiconductor base body has a floating body structure. Even with a structure in which a Fin transistor (see, for example, H. Jiang, N. Xu, B. Chen, L. Zeng1, Y. He, G. Du, X. Liu and X. Zhang: "Experimental investigation of self-heating effect (SHE) in multiple-SOI FinFETs," Semicond. Sci. Technol. 29 (2014) 115021 (7pp)) is formed on an SOI substrate, the present dynamic flash operation can be performed as long as the semiconductor base body has a floating body structure.

In "1" writing, electron-hole pairs may be generated using a gate induced drain leakage (GIDL) current (see, for example, E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, Vol. 53, No. 4, pp. 692-69, April 2006) and the semiconductor base body 7 may be filled with the generated positive hole groups 9.

Equations (1) to (12) in the present specification and drawings are used to quantitatively describe phenomena, and are not intended to limit the phenomena.

Besides, an example of conditions for the erase operation has been shown in FIGS. 4AA to 4AC and 4B. In contrast, if a situation in which the positive hole groups 9 in the semiconductor base body 7 are removed from both or one of the $N^+$ layer 3a and $N^+$ layer 3b can be realized, the voltages applied to the source line SL, The plate line PL, the bit line BL, and the word line WL may be changed.

Besides, in a vertical direction in FIG. 1, in that part of the semiconductor base body 7 which is surrounded by the insulating layer 6, which is the first insulating layer, potential distributions of a first channel Si layer 7a and second channel Si layer 7b are formed by being joined together. Consequently, the first channel Si layer 7a and second channel Si layer 7b of the semiconductor base body 7 are joined together in the vertical direction via a region surrounded by the insulating layer 6, which is the first insulating layer.

Besides, in FIG. 1, the first gate conductor layer 5a may be divided, in planar view or in a vertical direction, into two or more parts, which may be operated synchronously or asynchronously, each as a conductor electrode of a plate line, by a same drive voltage or different drive voltages. Similarly, the second gate conductor layer 5b may be divided, in planar view or in a vertical direction, into two or more parts, which may be operated synchronously or asynchronously, each as a conductor electrode of a word line, by a same drive voltage or different drive voltages. This also enables the dynamic flash memory operation. When the first gate conductor layer 5a is divided into two or more parts, at least one of the resulting first gate conductor layers serves the role of the first gate conductor layer 5a. Also, when the second gate conductor layer 5b is divided, at least one of the resulting second gate conductor layers serves the role of the second gate conductor layer 5b. In the vertical direction, one of the first gate conductor layer 5a and the second gate conductor layer 5b may be placed on opposite sides of the other gate conductor layer, i.e., the first gate conductor layer 5a or the second gate conductor layer 5b.

The conditions of the voltages applied to the bit lines BL, the source lines SL, the word lines WL, and the plate lines PL as well as the voltage of the floating body are exemplary in performing basic operations including erase operations, write operations, and read operations, and other voltage conditions that allow the basic operations of the present invention to be performed may be used.

The present embodiment has the following features.

Feature 1

In the dynamic flash memory cell according to the present embodiment, the $N^+$ layers 3a and 3b, which are to become the source and the drain, the semiconductor base body 7, the first gate insulating layer 4a, the second gate insulating layer 4b, the first gate conductor layer 5a, and the second gate conductor layer 5b are formed into the shape of a pillar as a whole. Then, the $N^+$ layer 3a to become the source is connected to the source line SL, the $N^+$ layer 3b to become the drain is connected to the bit line BL, the first gate conductor layer 5a is connected to the plate line PL, and the second gate conductor layer 5b is connected to the word line WL. The gate capacitance of the first gate conductor layer 5a connected with the plate line PL is structured to be higher than the gate capacitance of the second gate conductor layer 5b connected with the word line WL. In the present dynamic flash memory cell, the first gate conductor layer and the second gate conductor layer are stacked in the vertical direction. Consequently, even if the gate capacitance of the first gate conductor layer 5a connected with the plate line PL is structured to be higher than the gate capacitance of the second gate conductor layer 5b connected with the word line WL, the area of the memory cell is not increased in planar view. This makes it possible to achieve higher performance and greater packaging density of the dynamic flash memory cell at the same time. During the data read, if the voltage to be applied to the first gate conductor layer 5a joined to the plate line PL is set higher than the threshold voltage at a time when the logical storage data is "1" and lower than the threshold voltage at a time when the logical storage data is "0," the property that no current flows even if the voltage of the word line WL is increased is obtained. This leads to a further increase in an operating margin of the dynamic flash memory cell.

Feature 2

To fix bit lines to ground potential with word lines WL of memory cells selected as with the dynamic flash memory cells according to the first embodiment of the present invention is something one cannot do with conventional volatile memories. This is because DRAM is a destructive read-out memory and if bit lines BL are grounded with the word lines WL selected, accumulated charges on capacitors of the memory cells will be lost. Also, in the case of SRAM, the memory cell itself is made up of a flip-flop circuit, which in turn is made up of six transistors, but because miniaturized SRAM has a small memory cell current, if bit lines are grounded forcibly, storage data of the flip-flop circuit will be inverted. Thus, although this is something impossible with conventional volatile memories, with dynamic flash memory cells, storage data does not become corrupted even if the bit lines BL are grounded with the word lines WL selected. Consequently, the bit line shielding technique has been implemented for the first time for a volatile memory. This has made it possible to select odd-numbered bit lines and even-numbered bit lines alternately, ground one type of bit lines while the other type is being read, and thereby read data stably by reducing noise using the shielded bit lines.

Feature 3

In writing into the dynamic flash memory cells according to the first embodiment of the present invention, in "0" erased memory cells, even if the bit lines BL are grounded while the word lines WL are being selected, no "1" writing operation occurs. This is because in "0" erased memory cells, even if word lines WL are selected and a write voltage is applied to the word lines WL, as long as the bit lines BL are grounded, no current flows from drain to source of the memory cells, consequently no impact ionization phenomenon occurs, and thus no electron-hole pair is generated. With conventional nonvolatile memories such as NAND flash memories, writing into memory cells is done by grounding bit lines BL and applying a write voltage to word lines WL. Therefore, although this is something that cannot be implemented in semiconductor memories including the conventional nonvolatile memories, in the dynamic flash memory cell, when a word line WL is selected and a write voltage is being applied to the word line WL, even if the bit line BL is grounded, no "1" writing operation occurs in a "0" erased state and storage data does not become corrupted. This has made it possible to select odd-numbered bit lines and even-numbered bit lines alternately, ground one type of bit lines while the other type is being written, and thereby write data stably by reducing noise using the shielded bit lines.

Feature 4

In the dynamic flash memory cell according to the first embodiment of the present invention, the introduction of the bit line shielding technique has made it possible for an odd-numbered bit line and an even-numbered bit line to share one sense amplifier. This makes it possible to reduce the number of sense amplifier circuits in the memory array by half, reduce chip size accordingly, and thereby provide an inexpensive memory device.

Feature 5

Taking a look at the role of the first gate conductor layer 5a connected with the plate line PL of the dynamic flash memory cell according to the first embodiment of the present invention, when the dynamic flash memory cell performs write and read operations, the voltage of the word line WL swings up and down. In so doing, the plate line PL serves the role of reducing the capacitive coupling ratio between the word line WL and the semiconductor base body 7. This makes it possible to greatly reduce the effect of voltage variations of the semiconductor base body 7 when the voltage of the word line WL swings up and down. This in turn makes it possible to increase a difference in the threshold voltage of an SGT transistor of the word line WL, the difference representing logic "0" or logic "1." This leads to an increase in an operating margin of the dynamic flash memory cell.

Second Embodiment

A read operation of a memory device having an SGT according to a second embodiment will be described with reference to FIG. 7.

FIG. 7 shows a circuit block diagram of a block in which 3×4 dynamic flash memory cells shown in FIG. 6AC are arrayed in a matrix. Now a read operation will be described with reference to FIG. 7. The odd-numbered bit lines BL0$o$ and BL1$o$ are connected, respectively, with the memory cells C00$o$ to C02$o$ and C10$o$ to C12$o$, and the even-numbered bit lines BL0$e$ and BL1$e$ are connected, respectively, with the memory cells C00$e$ to C02$e$ and C10$e$ to C12$e$. The word lines WL0 to WL2 and the plate lines PL0 to PL2 are commonly connected to memory cells connected to even-numbered bit lines and memory cells connected to odd-numbered bit lines. Here, description will be given of a case in which, for example, the word line WL0 and the plate line PL0 are selected. First, the odd-number control line F1$o$ is inputted to the gates of the transistors Tr01$o$ and Tr11$o$, the even-numbered bit lines BL0$e$ and BL1$e$ are selected, and while storage data in the memory cells C00$e$ and C10$e$ are read to the even-numbered bit lines BL0$e$ and BL1$e$, the odd-numbered bit lines BL0$o$ and BL1$o$ remain fixed to the first voltage VR, which is, for example, 0 V. Then, the even-numbered bit lines BL0$e$ and BL1$e$ are connected, respectively, to even-numbered sense amplifier circuits (which are an example of an "even-numbered sense amplifier circuit" described in Claims) S/A0$e$ and S/A1$e$ and the odd-numbered bit lines BL0$o$ and BL1$o$ are connected, respectively, to odd-numbered sense amplifier circuits (which are an example of an "odd-numbered sense amplifier circuit" described in Claims) S/A0$o$ and S/A1$o$. Then, from sense amplifier circuit activation signal lines FAo and FAe, the sense amplifier circuit activation signal line FAe is selected, the even-numbered sense amplifier circuits S/A0$e$ and S/A1$e$ are activated, and read data of the even-numbered bit lines BL0$e$ and BL1$e$ is determined. When column selection lines CSL0$e$ and CSL1$e$ are inputted, the data read to the even-numbered sense amplifier circuits S/A0$e$ and S/A1$e$ is read in sequence to the input-output lines I/O and /I/O via transistors Tr0Ae, Tr0Be, Tr1Ae, and Tr1Be.

Similarly, the read data of the odd-numbered bit lines BL0$o$ and BL1$o$ is determined by the odd-numbered sense amplifier circuits S/A0$o$ and S/A1$o$.

Description of the read operation will be continued using FIG. 7, which is a circuit block diagram of a block in which 3×4 dynamic flash memory cells are arrayed in a matrix. In this way, the read operation here is the same as the first embodiment in that reading is done by shielding even-numbered bit lines or odd-numbered bit lines and selecting the other bit lines. This enables stable reading by reducing noise. However, since the odd-numbered bit line and the even-numbered bit line do not share a single sense amplifier circuit, the number of sense amplifier circuits cannot be reduced by half and consequently chip size reduction effects cannot be expected. However, for example, while data of the odd-numbered sense amplifier circuits S/A0$o$ and S/A1$o$ are being read to the input-output lines I/O and /I/O, read data of the even-numbered bit lines BL0$e$ and BL1$e$ can be determined by activating the even-numbered sense amplifier circuits S/A0$e$ and S/A1$e$. It is also possible to read data of the odd-numbered sense ampilifier circuits S/A0$o$ and S/A1$o$ and data of the even-numbered bit lines BL0e and BL1e alternately to the input-output lines I/O and /I/O.

Since it is not that the odd-numbered bit line and the even-numbered bit line share a single sense amplifier circuit, read operations can be performed by shielding even-numbered bit lines or odd-numbered bit lines and selecting the unshielded bit lines, and "1" writing operations can be performed with respect to the memory cells connected to the word lines WL that simultaneously select data of the odd-numbered sense amplifier circuits S/A0o and S/A1o and data of the even-numbered bit lines BL0e and BL1e. This provides the advantage of being able to increase the speed of reading and "1" writing operations.

Feature

Instead of sharing a single sense amplifier circuit between the odd-numbered bit line and the even-numbered bit line, it is possible to do reading stably by reducing noise using the bit line shielding technique during a read operation and increase the speed of reading and "1" writing operations because a sense amplifier circuit is not shared.

Third Embodiment

Figure 8A:
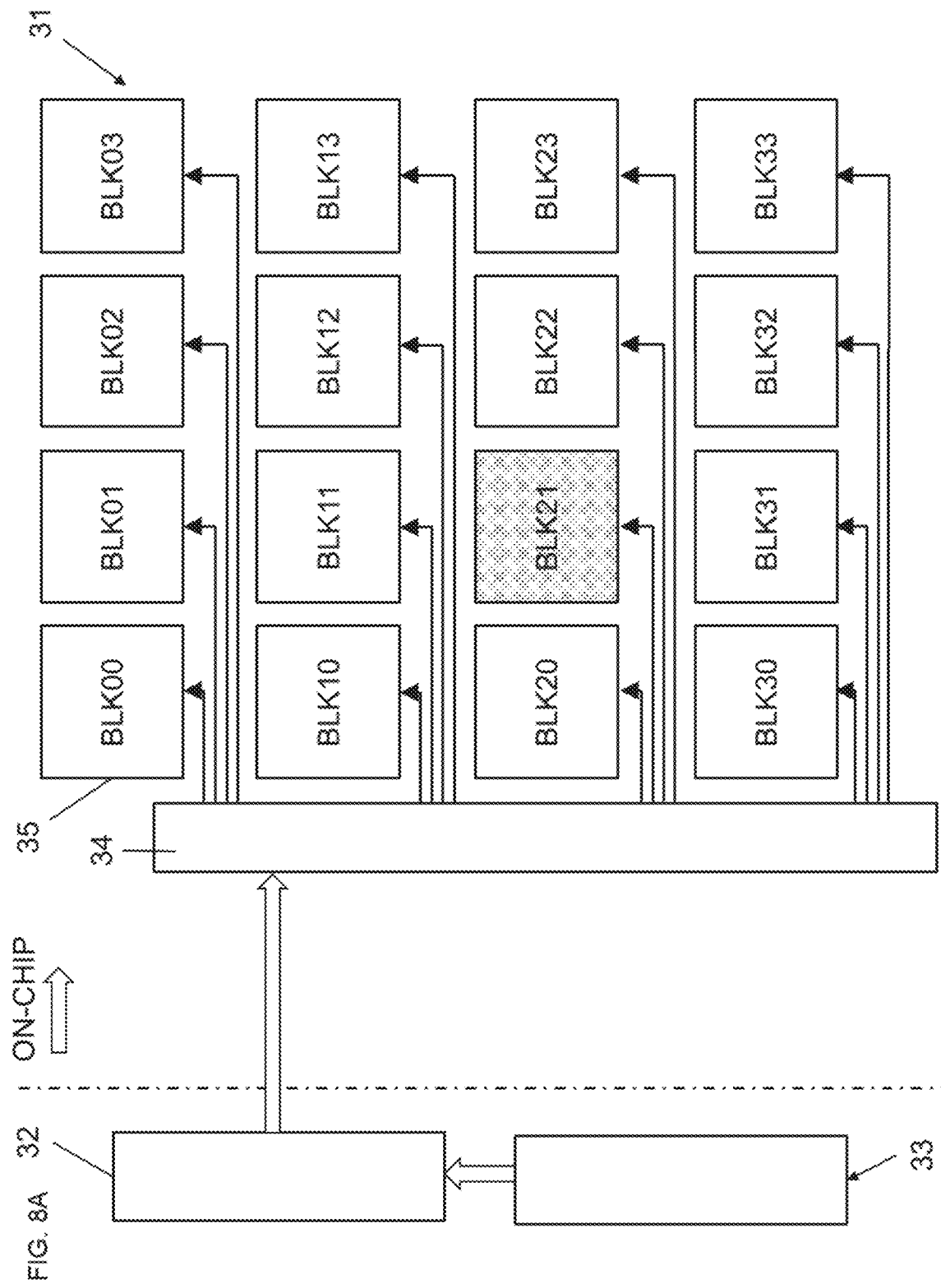
FIG. 8A is a diagram for explaining a memory array of a memory device having an SGT according to a third embodiment.
Figure 8B:
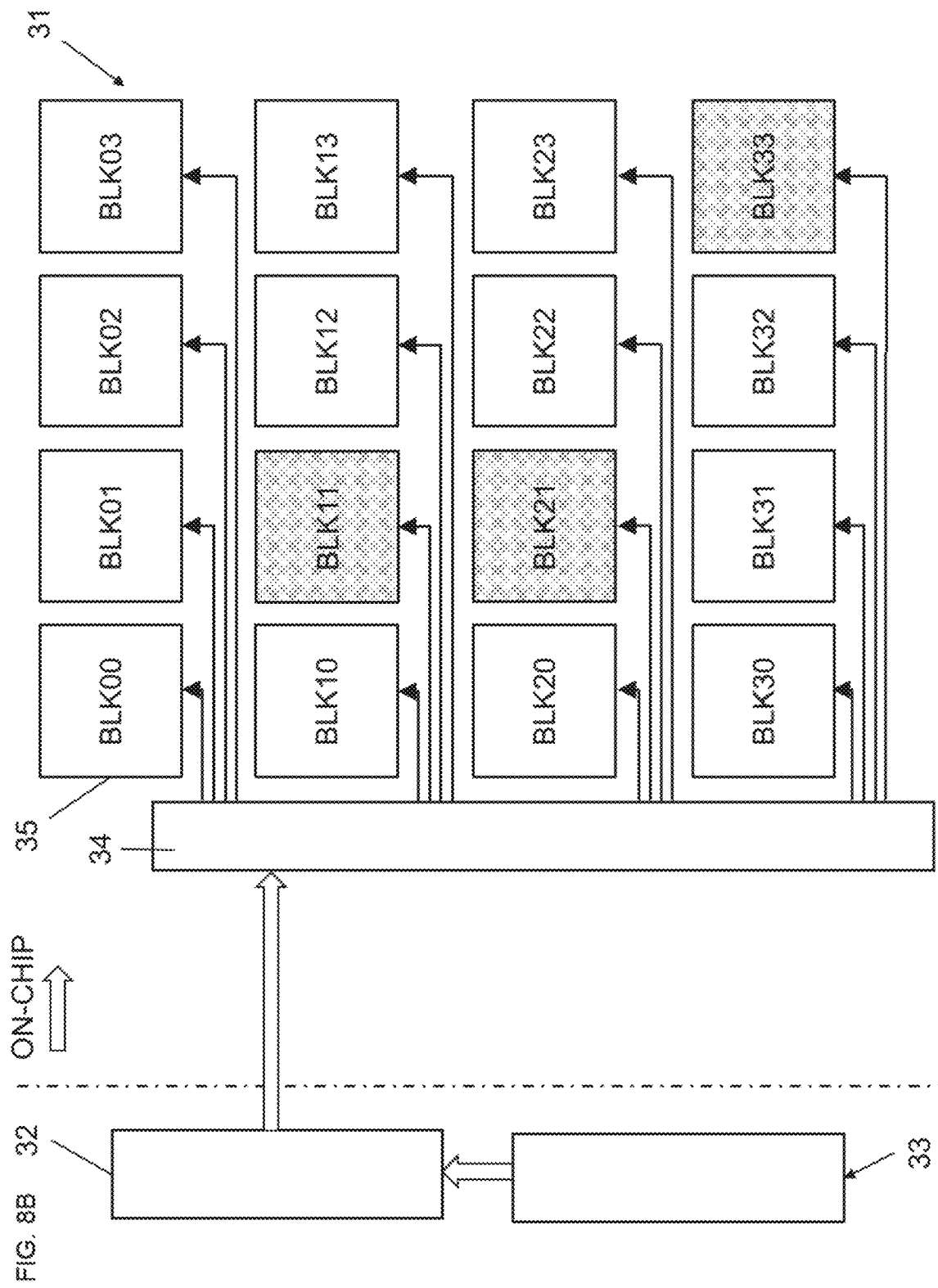
FIG. 8B is a diagram for explaining the memory array of the memory device having then SGT according to the third embodiment.
Figure 10:
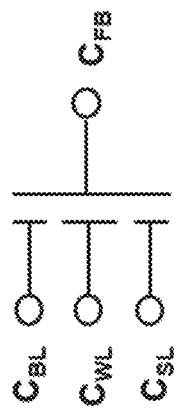
FIGS. 10A and 10B are diagrams for explaining problems in operations of the capacitorless DRAM memory cell according to the conventional example.
Figure 10:
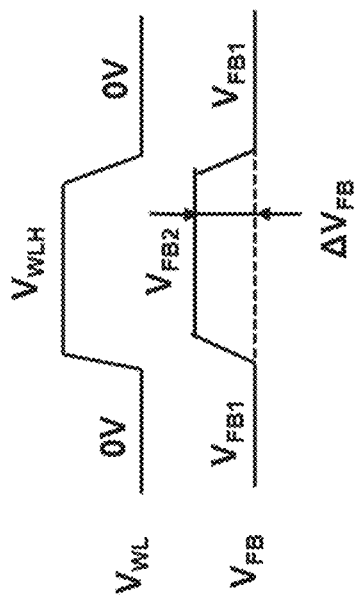

FIGS. 8A and 8B show circuit block diagrams of a chip of a dynamic flash memory cell according to a third embodiment.

In FIG. 8A, correspondence between data stored at logical-physical block addresses and physical block addresses of the dynamic flash memory is always managed by a controller circuit 33 and a logical-physical block address conversion lookup table circuit (abbreviated to logical-physical conversion table) 32. This is because in the dynamic flash memory, as with the flash memory, data in blocks are rewritten using already erased blocks, making it necessary to constantly manage correspondence between logical block addresses and physical block addresses. The controller circuit 33 and the logical-physical conversion table 32 may be provided in the chip of the dynamic flash memory, but may alternatively be provided outside the chip as shown in FIG. 8A. Commands from the logical-physical conversion table 32 are inputted to a block address decoder circuit 34 and blocks to be erased, written, or read are selected from blocks BLK00 to BLK33.

In FIG. 8A, it is assumed that a command to read storage data from block BLK21 out of 4×4=16 blocks, i.e., blocks BLK00 to BLK33 of the dynamic flash memory, is issued by the controller circuit 33. In FIG. 8B, it is assumed that a command to read storage data from three blocks BLK11, BLK21, and BLK33 is issued by the controller circuit 33. In this way, regarding block selection, not only one, but also multiple blocks may be selected and read simultaneously. Besides, for example, an erase operation of BLK11, a "1" writing operation of block BLK21, and a read operation of block BLK33 may be performed simultaneously. In this way, not only a same operation, but also different operations such as an erase operation, a write operation, and a read operation may be selected and performed simultaneously with respect to multiple blocks, making it possible to efficiently use a large-capacity dynamic flash memory.

Note that for block rewrite and block erase operations, a cache memory (not shown) may sometimes be necessary to temporarily store storage data of blocks to be rewritten. The cache memory may be provided within or outside the chip of the dynamic flash memory according to the present embodiment.

The logical-physical conversion table 32 or The cache memory may be made up of a memory cell array which in turn is made up of dynamic flash memory cells accessible at high speed.

Besides, to maintain storage data in blocks, a refresh operation may be performed on a block by block basis. In this case, because the block at the given physical address is refreshed, there is no need to perform a block rewrite operation or block erase operation.

Feature

The dynamic flash memory cell according to the third embodiment can be controlled separately on a block by block basis, making it possible to select two or more blocks and perform different modes of operation such as an erase operation, a write operation, and a read operation simultaneously. This in turn makes it possible to achieve a speedup and efficient use of the dynamic flash memory cell.

Other Embodiments

Note that whereas a Si pillar is formed in the present invention, a semiconductor pillar made of a semiconductor material other than Si may be used. This similarly applies to other embodiments of the present invention.

According to the third embodiment, the logical-physical conversion table in FIGS. 8A and 8B is provided outside the chip of the semiconductor memory device, but may be provided on-chip within the semiconductor memory device. This similarly applies to other embodiments of the present invention.

The memory element of the logical-physical conversion table in FIGS. 8A and 8B according to the third embodiment may be made up of a dynamic flash memory accessible at high speed. This similarly applies to other embodiments of the present invention.

By providing a timer circuit for each of the blocks BLK00 to BLK33 according to the third embodiment in FIGS. 8A and 6B, the block may be refreshed on instructions from the timer circuit. This similarly applies to other embodiments of the present invention.

In a vertical NAND-type flash memory circuit, using a semiconductor pillar as a channel, multiple stacks of memory cells made up of a tunnel oxide layer, a charge storage layer, an interlayer insulation layer, and a control conductor layer surrounding the semiconductor pillar are formed in the vertical direction. There are a source line impurity region corresponding to a source and a bit line impurity region corresponding to a drain on opposite ends of the semiconductor pillar of the memory cells. If, for one memory cell, one of memory cells on opposite sides of the memory cell is a source, the memory cell on the, other side serves as a drain. In this way, the vertical NAND-type flash memory circuit is a type of SGT circuits. Thus, the present invention is applicable to a mixed circuit with a NAND-type flash memory circuit.

In FIG. 1, in a structure in which polarity of conductivity type of each of the $N^+$ layers 3a and 3b and p-layer Si pillar 2 is reversed, the dynamic flash memory operation is performed. In this case, in the Si pillar 2, which is n-type, majority carriers become electrons. Thus, electron groups generated by impact ionization are accumulated in the semiconductor base body 7, and a "1" state is established. Alternatively, a junctionless structure, in which the $N^+$ layers 3a and 3b become $P^+$ layers or the p-layer Si pillar 2 becomes an n-layer Si pillar, may be used.

The present invention can be embodied or modified in various forms without departing from the spirit and scope of the present invention in a broad sense. Also, the embodiments described above are meant to be illustrative, and not to limit the scope of the present invention. The embodiments and variations described above can be combined as desired. Furthermore, even if some components of the embodiments described above are removed as required, the resulting inventions fall within the scope of the technical idea of the present invention.

INDUSTRIAL APPLICABILITY

The memory device that uses a semiconductor element according to the present invention provides a dynamic flash memory, which is a memory device that uses a high-density, high-performance SGT.

What is claimed is:

1. A semiconductor element memory device comprising a block in which a plurality of semiconductor memory cells is arrayed in a matrix on a substrate, each of the semiconductor memory cells contained in the block in turn including:
   a semiconductor base body erected on a substrate in a vertical direction of the substrate or extended on the substrate in a horizontal direction,
   a first impurity region and a second impurity region provided on opposite ends of the semiconductor base body;
   a gate insulating layer placed in contact with a lateral surface of the semiconductor base body between the first impurity region and the second impurity region;
   a first gate conductor layer covering part or all of the gate insulating layer; and
   a second gate conductor layer located adjacent to the first gate conductor layer and placed in contact with a lateral surface of the gate insulating layer,
   wherein positive hole groups generated by an impact ionization phenomenon or by a gate-induced drain leakage current are held in the semiconductor base body by controlling voltages applied to the first gate conductor layer, the second gate conductor layer, the first impurity region, and the second impurity region,
   a memory write operation is performed by setting a voltage of the semiconductor base body to a first data retention voltage higher than a voltage of the first impurity region and/or the second impurity region by about a built-in voltage,
   a memory erase operation is performed by controlling voltages applied to the first impurity region, the second impurity region, the first gate conductor layer, and the second gate conductor layer and thereby extracting the positive hole groups from one or both of the first impurity region and the second impurity region,
   the voltage of the semiconductor base body is set to a second data retention voltage lower than the first data retention voltage,
   in the block, the first impurity region of each of the semiconductor memory cells is connected with a source line and the second impurity region is connected alternately with an odd-numbered bit line and an even-numbered bit line and one of the first and second gate conductor layers is connected with a word line and another is connected with a first drive control line, and in the block, using voltages applied to the source line, the bit lines, the first drive control line, and the word line, storage data of a plurality of the semiconductor base bodies selected by the word line is read alternately to the odd-numbered bit line and the even-numbered bit line.

2. The semiconductor element memory device according to claim 1, wherein the storage data of the semiconductor base body is read alternately to the odd-numbered bit line and the even-numbered bit line and sense amplifier circuits alternately determine whether the storage data is write data or erase data.

3. The semiconductor element memory device according to claim 2, wherein the odd-numbered bit line and the even-numbered bit line share one sense amplifier.

4. The semiconductor element memory device according to claim 2, wherein the odd-numbered bit line is inputted to an odd-numbered sense amplifier circuit and the even-numbered bit line is inputted to an even-numbered sense amplifier circuit.

5. The semiconductor element memory device according to claim 1, wherein an operation of reading the storage data of the semiconductor base body through one of the odd-numbered bit line and the even-numbered bit line with another of the bit lines fixed to a first voltage and an operation of reading the storage data through the other of the bit lines with the one of the bit lines fixed to the first voltage are performed alternately.

6. The semiconductor element memory device according to claim 5, wherein the first voltage is ground voltage.

7. The semiconductor element memory device according to claim 1, wherein the memory write operation is performed by selecting the odd-numbered bit line and the even-numbered bit line simultaneously.

8. The semiconductor element memory device according to claim 1, wherein the memory write operation is performed by alternately selecting the odd-numbered bit line and the even-numbered bit line.

9. The semiconductor element memory device according to claim 1, wherein the memory write operation is performed by alternating an operation of selecting one of the odd-numbered bit line and the even-numbered bit line with another of the bit lines fixed to a second voltage and an operation of selecting the other of the bit lines with the one of the bit lines fixed to the second voltage.

10. The semiconductor element memory device according to claim 1, wherein first gate capacitance between the first gate conductor layer and the semiconductor base body is higher than second gate capacitance between the second gate conductor layer and the semiconductor base body.

11. The semiconductor element memory device according to claim 1, wherein one or both of the first gate conductor layer and the second gate conductor layer are divided into two or more separate gate conductor layers in planar view or in a vertical direction and the separate Gate conductor layers are operated synchronously or asynchronously.

12. The semiconductor element memory device according to claim 11, wherein in the vertical direction, either the separate gate conductor layers of the first gate conductor layer are placed on opposite sides of the second gate conductor layer, or the separate gate conductor layers of the second gate conductor layer are placed on opposite sides of the first gate conductor layer.

* * * * *

UNITED STATES PATENT AND TRADEMARK OFFICE
CERTIFICATE OF CORRECTION

| | | |
|---|---|---|
| PATENT NO. | : 12,396,153 B2 | Page 1 of 1 |
| APPLICATION NO. | : 18/226096 | |
| DATED | : August 19, 2025 | |
| INVENTOR(S) | : Koji Sakui and Nozomu Harada | |

It is certified that error appears in the above-identified patent and that said Letters Patent is hereby corrected as shown below:

In the Claims
Column 22, Claim 11, Line 55, delete "Gate"
And replace with --gate--

Signed and Sealed this
Twenty-third Day of September, 2025

John A. Squires
*Director of the United States Patent and Trademark Office*